United States Patent
Tsuruzawa et al.

(10) Patent No.: US 7,556,510 B2
(45) Date of Patent: Jul. 7, 2009

(54) MOUNTING STRUCTURE OF CONNECTOR AND METHOD FOR MOUNTING CONNECTOR ON SUBSTRATE

(75) Inventors: Tadashi Tsuruzawa, Chiryu (JP); Fumio Ohara, Okazaki (JP); Takayoshi Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/699,430

(22) Filed: Jan. 30, 2007

(65) Prior Publication Data

US 2007/0178725 A1 Aug. 2, 2007

(30) Foreign Application Priority Data

Jan. 31, 2006 (JP) .............................. 2006-021667

(51) Int. Cl.
*H01R 12/00* (2006.01)
(52) U.S. Cl. ........................................ 439/83; 439/79
(58) Field of Classification Search ................... 439/79, 439/83, 567
See application file for complete search history.

(56) References Cited

U.S. PATENT DOCUMENTS

| | | | |
|---|---|---|---|
| 4,583,807 A * | 4/1986 | Kaufman et al. ............... 439/83 |
| 5,108,308 A | 4/1992 | Northcraft et al. | |
| 5,184,963 A * | 2/1993 | Ishikawa ..................... 439/79 |
| 5,186,633 A | 2/1993 | Mosser, III | |
| 5,192,228 A | 3/1993 | Collins et al. | |
| 5,297,966 A * | 3/1994 | Brennian et al. ............... 439/64 |
| 5,580,269 A * | 12/1996 | Fan .............................. 439/79 |
| 5,957,722 A * | 9/1999 | Pan et al. ..................... 439/567 |
| 6,077,115 A | 6/2000 | Yang et al. | |
| 6,109,961 A | 8/2000 | Chen et al. | |
| 6,273,732 B1 * | 8/2001 | Johnescu et al. ............... 439/79 |
| 6,407,925 B1 * | 6/2002 | Kobayashi et al. ........... 361/752 |
| 6,866,524 B2 * | 3/2005 | Takata ......................... 439/83 |
| 2001/0010978 A1 * | 8/2001 | Paagman ..................... 439/79 |

FOREIGN PATENT DOCUMENTS

| | | |
|---|---|---|
| JP | A-03-276582 | 12/1991 |
| JP | A-04-349374 | 12/1992 |
| JP | A-08-315881 | 11/1996 |
| JP | A-2003-288957 | 10/2003 |

OTHER PUBLICATIONS

Examination Report dated Feb. 4, 2009 in correspond European patent application No. 07001928.6-1528 (and English translation). Extended Search Report dated Jul. 22, 2008 in corresponding European patent application No. 07001928.6.

* cited by examiner

*Primary Examiner*—Briggitte R Hammond
*Assistant Examiner*—Vanessa Girardi
(74) *Attorney, Agent, or Firm*—Posz Law Group, PLC

(57) ABSTRACT

A mounting structure includes: a surface mounting connector including a housing and a plurality of terminals; a substrate including a plurality of lands, each of which is electrically connected to the terminal with a bonding member; a plurality of support portions for supporting the connector on the substrate; and a plurality of fixing members for positioning the connector on the substrate. Each fixing member is connected to the housing, and contacts a part of the substrate, which is different from a surface portion of the substrate contacting the support portion. Each terminal is positioned on the substrate with a predetermined distance between the terminal and the substrate by the support portions and the fixing members.

41 Claims, 12 Drawing Sheets

MOUNTING STRUCTURE OF CONNECTOR AND METHOD FOR MOUNTING CONNECTOR ON SUBSTRATE

CROSS REFERENCE TO RELATED APPLICATION

This application is based on Japanese Patent Application No. 2006-21667 filed on Jan. 31, 2006, the disclosure of which is incorporated herein by reference.

FIELD OF THE INVENTION

The present invention relates to a mounting structure of a connector and a method for mounting a connector on a substrate.

BACKGROUND OF THE INVENTION

In recent years, a surface mounting type connector mounted to a substrate surface has been used instead of an insertion type connector for inserting a terminal into the substrate from the viewpoint of high density, compactness and efficiency of mounting. This is disclosed in, for example, U.S. Pat. No. 6,866,524.

In U.S. Pat. No. 6,866,524, a structure and a mounting method for mounting the connector of the surface mounting type to the substrate is disclosed. Concretely, the housing is supported by first melting solder interposed between the housing of the connector and the substrate in a state in which the housing is floated on the substrate. The housing attaining this supporting state is positioned such that the terminal is located at a land center by the action of surface tension of second melting solder interposed between the terminal and the land. The positioned housing is then mechanically fixed (e.g., fastened by screws) onto the substrate in a state in which the first and second melting solders are respectively solidified by cooling.

When the number of terminals of the connector is generally increased, it becomes difficult to secure coplanarity of terminal tips (specifically, a joining part to the land). Further, it becomes difficult to secure connection of all the terminals and the corresponding lands by the influences of a warp of the substrate and a warp of the housing.

In the construction, at a time point before the melting solder is cooled and solidified, the terminal is positioned in the corresponding land by a self alignment effect using the second melting solder in a planar direction of the substrate. Further, the terminal is not positioned in the corresponding land and is in a free state in a thickness direction of the substrate, i.e., in a height direction with respect to a substrate surface. Accordingly, a warp is caused in the substrate and the housing by thermal expansion in a reflow process (specifically, a melting state of the first and second melting solders) so that the distance between the terminal and the substrate surface is dispersed. Namely, there is a problem of a reduction in connection reliability.

SUMMARY OF THE INVENTION

In view of the above-described problem, it is an object of the present disclosure to provide a mounting structure of a connector. It is another object of the present disclosure to provide a method for mounting a connector.

According to a first aspect of the present disclosure, a mounting structure includes: a surface mounting connector including a housing and a plurality of terminals, wherein each terminal extends from the housing; a substrate including a plurality of lands, each of which corresponds to the terminal, wherein each land is disposed on the substrate, and wherein each land is electrically connected to the terminal with a bonding member; a plurality of support portions for supporting the connector on the substrate, wherein each support portion protrudes from the housing toward the substrate, and contacts a surface portion of the substrate; and a plurality of fixing members for fixing and positioning the connector with respect to the substrate, wherein each fixing member is connected to the housing, and contacts a part of the substrate, which is different from the surface portion of the substrate contacting the support portion. Each terminal is positioned on the substrate with a predetermined distance between the terminal and the substrate by the support portions and the fixing members.

In the above structure, it is possible to reduce deformation (warp) of the connector mounting area of the substrate and the housing due to thermal expansion at, at least, a reflow time. Further, connection reliability of the terminal and the corresponding land can be improved.

According to a second aspect of the present disclosure, a method for mounting a surface mounting connector on a substrate includes: positioning and fixing the connector having a plurality of terminals on the substrate having a plurality of lands in such a manner that each terminal of the connector is disposed on a corresponding land of the substrate through a bonding member; and bonding each terminal to the corresponding land through the bonding member by heating and melting the bonding member. In the above method, connection reliability of the terminal and the corresponding land can be improved.

BRIEF DESCRIPTION OF THE DRAWINGS

The above and other objects, features and advantages of the present invention will become more apparent from the following detailed description made with reference to the accompanying drawings. In the drawings:

FIGS. 4A to 4C are typical views showing a mounting method of the connector to the print board, wherein FIGS. 4A and 4B show a positioning fixation process, and FIG. 4C shows a joining process;

FIGS. 5A to 5C are typical views showing a mounting method of a connector to a print board in accordance with a second embodiment mode, wherein FIGS. 5A and 5B show a positioning fixation process, and FIG. 5C is a view showing a joining process;

FIGS. 7A to 7C are typical views showing a mounting method of a connector to a print board in accordance with the third embodiment mode, wherein FIGS. 7A and 7B show a positioning fixation process, and FIG. 7C is a view showing the positioning fixation process and a joining process;

FIGS. 9A to 9C are typical views showing a mounting method of a connector to a print board in accordance with the fourth embodiment mode, wherein FIGS. 7A and 7B are views showing a positioning fixation process, and FIG. 9C is a view showing the positioning fixation process and a joining process;

FIGS. 10A to 10C are typical views showing a mounting method of a connector to a print board in accordance with a fifth embodiment mode, wherein FIGS. 10A and 10B are views showing a positioning fixation process, and FIG. 10C is a view showing a joining process;

FIGS. 13A to 13C are typical views showing a mounting method of a connector to a print board in accordance with the sixth embodiment mode, wherein FIGS. 13A and 13B are views showing a positioning fixation process, and FIG. 13C is a view showing a joining process;

FIGS. 15A to 15C are typical views showing a mounting method of a connector to a print board in accordance with the seventh embodiment mode, wherein FIGS. 15A and 15B are views showing a positioning fixation process, and FIG. 15C is a view showing a joining process;

FIGS. 16A to 16C are typical views showing a mounting method of a connector to a print board in accordance with an eighth embodiment mode, wherein FIGS. 16A and 16B are views showing a positioning fixation process, and FIG. 16C is a view showing a joining process;

FIGS. 17A and 17B are views for explaining the construction of a support portion and a fixing means in accordance with a ninth embodiment mode, wherein FIG. 17A is a side view seen from the longitudinal direction of a connector, and FIG. 17B is a front view.

DETAILED DESCRIPTION OF THE PREFERRED EMBODIMENTS

In the following embodiment modes, a connector mounted to a substrate is applied to an electronic controller constituting an engine ECU (i.e., Electronic Control Unit) of a vehicle as one example.

First Embodiment Mode

Figure 1:
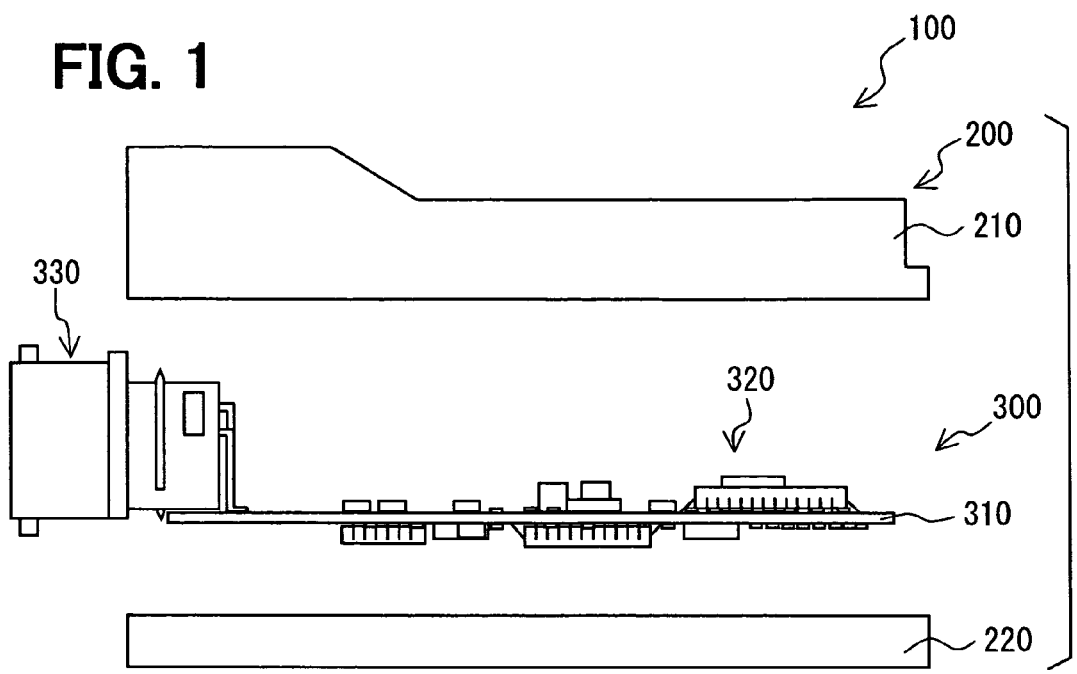
FIG. 1 is an exploded view showing an electronic controller before assembly.

First, the schematic construction of the electronic controller will be explained by using FIG. 1. FIG. 1 is an exploded view for explaining the schematic construction of the electronic controller and showing a state before assembly. As shown in FIG. 1, the electronic controller 100 is constructed by a box body 200 and a circuit substrate 300 stored within the box body 200.

For example, the box body 200 is constructed by a metallic material of aluminum, iron, etc. and a synthetic resin material. The box body 200 is constructed by a case 210 of a box shape opened on one side, and a cover 220 of a shallow bottom approximately formed in a rectangular shape and blocking an opening face of the case 210. The box body 200 having an internal space for storing the circuit substrate 300 is constructed by assembling the case 210 and the cover 220. In this embodiment mode, the case 210 and the cover 220 are constructed so as to be fixed by screw fastening. The box body 200 is not limited to a structure constructed by two members formed by the case 210 and the cover 220. The box body 200 may be also constructed by one member, and may be also constructed by three or more members.

In the circuit substrate 300, an electronic part 320 such as a micro computer, a power transistor, a resistor, a capacitor, etc. and a connector 330 as an input-output portion (specifically, external connecting terminal) are mounted to a print board 310 forming unillustrated wirings and a via hole, etc. for connecting portions between the wirings. A publicly known material such as thermoplastic resin, thermosetting resin, ceramic, a composite body of glass (e.g., glass cloth) and resin, etc. can be adopted as a constructional material of the print board 310.

Figure 2A:
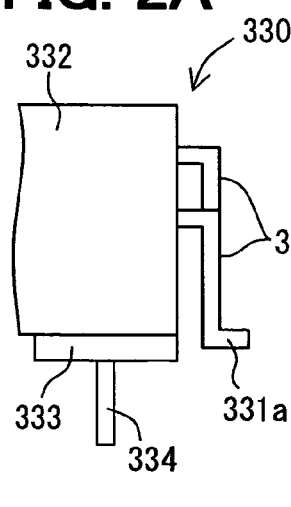
FIG. 2A is a side view and FIG. 2B is a front view showing a connector in the electronic controller.
Figure 2B:
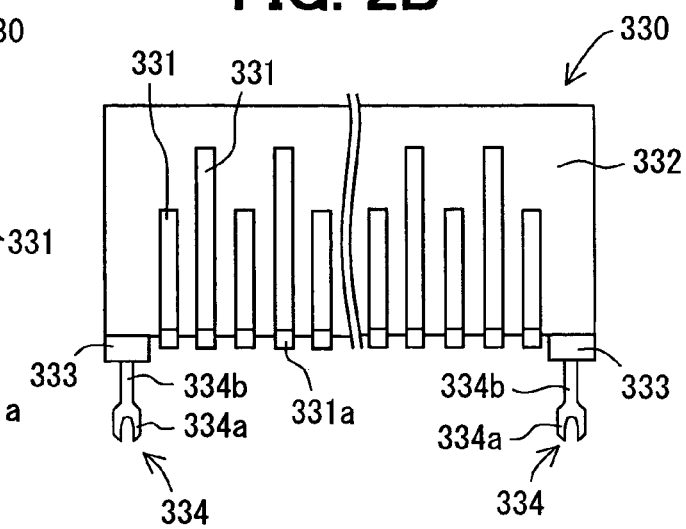
Figure 3:
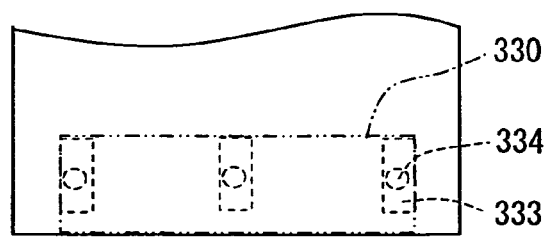
FIG. 3 is a plan view showing arrangement of a support portion and a fixing pin with respect to a print board.
Figure 4A:
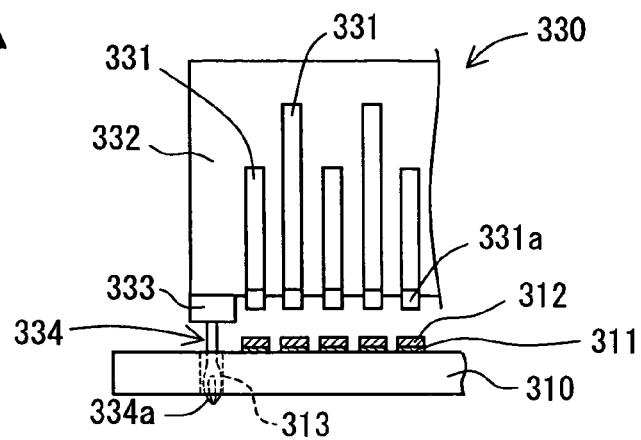
Figure 4B:
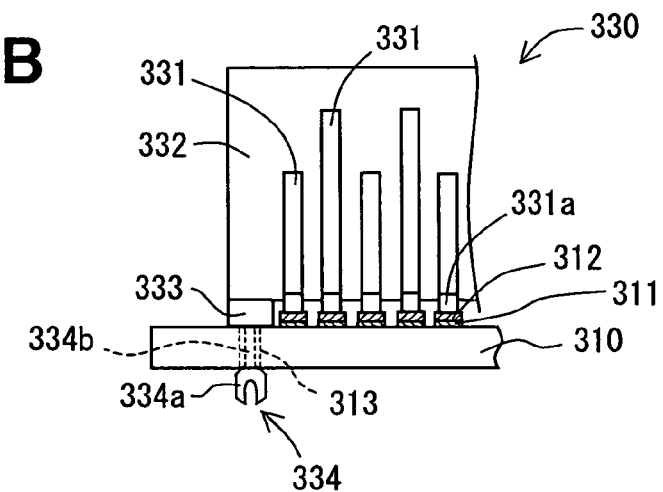
Figure 4C:
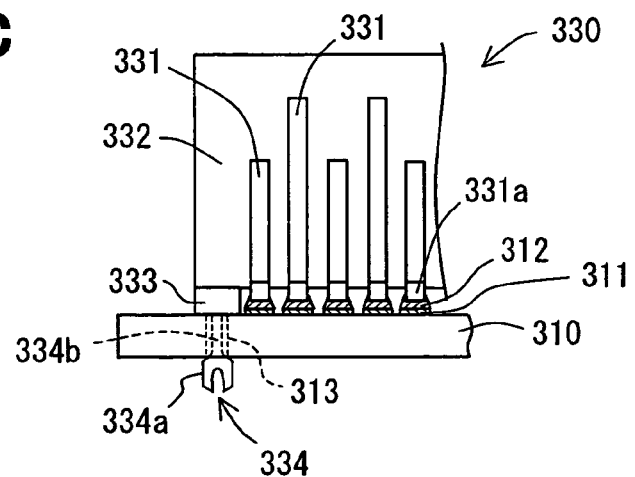

In the electronic controller 100 of such a construction, this embodiment mode is characterized in the mounting structure and the mounting method of the connector 330 mounted to the print board 310. This characteristic point will be explained by using FIGS. 2A and 2B and FIGS. 3 and 4. FIGS. 2A and 2B are typical views showing the characteristic point of the connector 330. FIG. 2A is a side view seen from the longitudinal direction. FIG. 2B is a front view of the connector 330. FIG. 3 is a plan view showing the arrangement of a support portion and a fixing pin with respect to the print board 310. FIGS. 4A to 4C are typical views showing the mounting method of the connector 330 to the print board 310. FIGS. 4A and 4B are views showing a positioning fixation process. FIG. 4C is a view showing a joining process. FIGS. 4A to 4C also illustrate a through hole (specifically, a fixing pin within the through hole) of the print board not located on the same straight line as a land (i.e., a joining portion of a terminal) for convenience of the explanation.

As shown in FIGS. 2A and 2B, the connector 330 is a connector of a surface mounting type constructed by an electrically conductive material. One end of the connector 330 is mounted to the surface of the print board 310. At the other end of the connector 330, plural terminals 331 exposed to the exterior of the box body 200 are arranged in a housing 332 constructed by an insulating material (e.g., synthetic resin). Concretely, an unillustrated notch portion for a connector corresponding to the connector 330 is arranged in the box body 200 (specifically, a case 210 in this embodiment mode). One portion (including a joining area of the terminal 331 to the print board 310) of the connector 330 is stored within the box body 200 in a state in which the case 210 and the cover 220 are fastened by screws so as to store the circuit substrate 300. The remaining portion (including a non-joining side of the terminal 331) is exposed to the exterior of the box body 200.

For example, the plural terminals 331 are so-called punching terminals formed by punching a metallic plate, and are partially buried and fixed to the housing 332 such that no plural terminals 331 mutually interfere. A side of the terminal 331 mounted to the print board 310 is projected approximately in parallel with the print board 310 from one side face of the housing 332, and is bent downward (on the print board 310 side). A tip area of a bent part is bent so as to be approximately parallel to the print board 310, and is constructed as a joining portion 331a to a land arranged in the print board 310. This embodiment mode shows a mode in which the plural terminals 331 are arranged in two columns with respect to the housing 332, and the joining portion 331a is arranged in one column with respect to the print board 310. However, no arrangement of the terminal 331 is limited to the above example.

The housing 332 includes a support portion 333 projected toward the surface of the print board 310 from the housing 332, and coming in contact with the surface of the print board 310 and supporting the connector 330 on the print board 310. The support portion 333 in accordance with this embodiment mode is integrally molded as one portion of the housing 332 by using the same material as the housing 332, and is arranged on a lower face of the housing 332. Namely, the support portion 333 is constructed as one portion of the housing 332. Further, the height of the support portion 333 projected from the housing 332 is adjusted such that the joining portion 331a of the terminal 331 abuts on solder arranged on a corresponding land surface in a state in which the support portion 333 comes in contact with the surface of the print board 310. In this embodiment mode, this height is adjusted such that the joining portion 331a of the terminal 331 abuts on the solder, and does not come in direct contact with the land.

Further, a fixing pin 334 as a fixing means is integrally arranged in the housing 332. The fixing pin 334 comes in contact with a part of the print board 310 different from a contact part of the support portion 333 in a state in which the fixing pin 334 is partially fixed to the housing 332 and the support portion 333 comes in contact with the surface of the print board 310. The fixing pin 334 positions and fixes the connector 330 with respect to the print board 310 together with the support portion 333. Namely, the fixing pin 334 is constructed as one portion of the housing 332.

The fixing pin 334 in accordance with this embodiment mode is constructed by a metallic material, and is partially buried and fixed to the housing 332. A projection tip with respect to the housing 332 is constructed so as to be inserted into a through hole for positioning fixation arranged in the print board 310. The projection tip is constructed so as to be inserted into the through hole as a spring portion 334a elastically deformed in a predetermined range from the projection tip. More concretely, as shown in FIG. 2B, the spring portion 334a is constructed as a nip spring in which the predetermined range from the tip is branched into two portions. The spring portion 334a is fixed to the housing 332 through a connecting portion 334b slightly thinner than the diameter of the through hole. Thus, when the connecting portion 334b is set to be Approximately slightly thinner than the diameter of the through hole, the connecting portion 334b is easily inserted into the through hole, and the position of the connector 330 in a planar direction can be preferably determined (specifically, the terminal 331 can come in contact with solder of the corresponding land surface in the planar direction) by the connecting portion 334b inserted into the through hole. Further, the fixing pin 334 is fixed to the support portion 333 as one portion of the housing 332. In a state in which the support portion 333 comes in contact with the surface of the print board 310, the spring portion 334a of the fixing pin 334 is constructed so as to pass through the through hole and come in contact with the rear face of the print board 310 (specifically, the rear face of a mounting face of the terminal 331).

Three support portions 333 and three fixing pins 334 in accordance with this embodiment mode are arranged as shown in FIG. 3, and are mutually separately arranged in the longitudinal direction of the connector 330. More concretely, the support portion 333 and the fixing pin 334 are respectively arranged between both end portions of the longitudinal direction of the connector 330 (specifically, housing 332) and these end portions. In FIG. 3, an arranging area of the connector 330 in the print board 310 is shown by a two-dotted chain line, and arranging positions of the support portion 333 and the fixing pin 334 are shown by a broken line.

Next, the mounting method for mounting the connector 330 constructed in this way to the print board 310 will be explained by using FIGS. 4A to 4C.

First, the print board 310 and the connector 330 are respectively prepared. In a preparing process of the print board 310, a land 311 corresponding to the joining portion 331a of the terminal 331 is formed on the surface of the print board 310. For example, solder 312 of a paste shape is arranged on the surface of the land 311 by a screen printing method. This solder 312 corresponds to a joining material shown in claims. No constructional material of the solder 312 is particularly limited. Further, for example, a through hole 313 corresponding to the fixing pin 334 and passing through a portion between the surface and the rear face of the print board 310 is formed by drill processing and laser processing. Further, in a preparing process of the connector 330, for example, the housing 332 and the support portion 333 are injection-molded with the terminal 331 and the fixing pin 334 as insert parts. As mentioned above, the diameter of the through hole 313 is constructed so as to be thicker than the connecting portion 334b of the fixing pin 334 and the tip of the spring portion 334a. At least one portion of the spring portion 334a is constructed so as to be thicker than the diameter of the through hole 313 in a state not applied by external force.

When the preparation of the print board 310 and the connector 330 is terminated, as shown in FIG. 4A, the fixing pin 334 is inserted into the through hole 313 formed in the print board 310 with this through hole 313 as a mark. Concretely, when the connector 330 is pressed against the print board 310 (or the print board 310 is pressed against the connector 330) in a state in which the tip of the fixing pin 334 is inserted into the through hole 313, the spring portion 334a of the fixing pin 334 is elastically deformed and the spring portion 334a connected to this tip is inserted into the through hole 313. The spring portion 334a partially comes in contact with an inner wall face of the through hole 313 in a state inserted into the through hole 313.

Subsequently, when the connector 330 is pressed against the print board 310 (or the print board 310 is pressed against the connector 330), the spring portion 334a is pushed and advanced within the through hole 313 while the spring portion 334a is elastically deformed. As shown in FIG. 4B, the support portion 333 then comes in contact with the surface of the print board 310, and the spring portion 334a perfectly passes through the through hole 313. This spring portion 334a comes in contact with the rear face of the print board 310 (including a boundary portion or a corner portion with respect to the through hole 313) so as to be intended to return the spring portion 334a to its original shape, or comes in contact with this rear face by returning the spring portion 334a to the original shape. Namely, the connector 330 is positioned by the support portion 333 with respect to the print board 310 in the thickness direction. Further, the connector 330 is positioned with respect to the print board 310 in the planar direction by the connecting portion 334b slightly thinner than the through hole 313 and inserted into the through hole 313. Further, the print board 310 is nipped and supported by the support portion 333 and the spring portion 334a of the fixing pin 334, and both the above positioning states are fixed. Accordingly, each terminal 331 can secure a mode coming in contact with the solder 312 arranged on the corresponding land by this positioning fixation. In this embodiment mode, the positioning fixation is executed before the reflow, and a punching terminal having small shape dispersion is adopted as the terminal 331. Accordingly, it is possible to secure a mode in which the joining portion 331a comes in contact with the solder 312 arranged on the corresponding land without coming in direct contact with the corresponding land 311 by the above positioning fixation in each terminal 331.

The reflow is executed in this positioning fixation state. Namely, as shown in FIG. 4C, the terminal 331 (specifically, a joining portion 331a) and the corresponding land 311 are joined through the solder 312 by heating and melting the solder 312 and then cooling and solidifying the solder 312. This process corresponds to a joining process shown in claims. In this embodiment mode, the connector 330 is positioned and fixed to the print board 310 by plural support portions 333 and plural fixing pins 334. A connector mounting area of the print board 310 and the housing 332 of the connector 330 mounted to the print board 310 are rigid. Accordingly, it is possible to reduce (i.e., restrain) deformation (i.e., warp) of the print board 310 and the housing 332 due to thermal expansion at the reflow time. Further, at a time point at which the solder 312 is cooled and solidified, the connector 330 is positioned and fixed to the print board 310 such that the terminal 331 abuts on the solder 312 on the corresponding land by the support portion 333 and the fixing pin 334. Accordingly, at the time point at which the solder 312 is cooled and solidified, each terminal 331 reliably comes in contact with the solder 312 on the corresponding land. Thus, connection reliability of the terminal 331 and the corresponding land 311 can be improved.

Thus, in accordance with the mounting structure and the mounting method of the connector 330 in this embodiment mode, at the cooling-solidifying time point of the solder 312, each terminal 331 is positioned and fixed in a state coming in contact with the solder 312 on the corresponding land. Accordingly, connection reliability of the terminal 331 and the corresponding land 311 can be improved. In particular, when a terminal number of the connector 330 is increased, it becomes difficult to secure co-planarity of the joining portion 331a. Further, it becomes difficult to secure the connection of all the terminals 331 and the corresponding lands 311 by influences of the warp of the print board 310 and the warp of the housing 332. However, in accordance with the mounting structure and the mounting method of the connector 330 in this embodiment mode, it is particularly effective with respect to the connector 330 of many pins. Concretely, for example, it is particularly effective with respect to the connector 330 having 50 or more terminals 331, preferably 100 or more terminals 331. The connector 330 in accordance with this embodiment mode has 200 terminals 331.

Further, in this embodiment mode, the fixing pin 334 is arranged integrally with the housing 332, and it is possible to collectively perform contact of the support portion 333 onto the surface of the print board 310 and contact of the fixing pin 334 onto the rear face of the print board 310. Accordingly, the number of works can be reduced.

Further, in this embodiment mode, an example for respectively arranging the support portion 333 and the fixing pin 334 between both end portions of the longitudinal direction of the connector 330 (specifically, housing 332) and their end portions so as to be separated from each other is shown. Accordingly, the warp of the print board 310 and the warp of the housing 332 can be further reduced. In particular, at a thermal expansion time, it is effective to reduce the warp caused in the print board 310 by weight of the housing 332. However, the numbers and arrangements of support portions 333 and fixing pins 334 are not limited to the above example. It is sufficient to arrange plural support portions 333 and plural fixing pins 334.

If each of plural terminals 331 abuts on the solder 312 on the corresponding land, at least one portion of the plural terminals 331 may also come in contact with the land 311. However, when the terminal 331 is joined to the corresponding land 311 in a strongly pressed state, stress due to the pressing is left in a joining portion. Therefore, connection reliability is easily reduced by the action of external stress. Accordingly, it is preferable to set the height (i.e., a predetermined height) of the terminal 331 with respect to a substrate surface prescribed by the support portion 333 to a height able to improve connection reliability of the terminal 331 and the corresponding land 311. In other words, it is preferable to set the height of the terminal 331 to a height at which the terminal 331 can secure an electric connecting state with the corresponding land 311 through the solder 312, and no stress due to pressing is almost left in the joining portion of the terminal 331 and the corresponding land 311 in a solidifying state of the solder 312.

In contrast to this, in this embodiment mode, an example for positioning each terminal 331 at a height for coming in no direct contact with the corresponding land 311 is shown. In this case, the solder 312 is arranged between opposite faces of the terminal 331 and the land 311, and a contact area with the solder 312 is increased. Further, no terminal 331 is pressed against the land 311 (specifically, a state abutting on the solder 312 but slightly floated with respect to a land surface is set). Accordingly, no stress due to the pressing is left in the joining portion in a solidifying state of the solder 312. Further, breaking, bending, etc. of the terminal 331 due to the pressing can be prevented. Accordingly, connection reliability can be further improved. In this embodiment mode, a punching terminal having an elastic deforming amount smaller than that of a so-called bending terminal formed by bending a metal of a bar shape is adopted as the terminal 331. Therefore, stress due to the pressing is easily caused. However, breaking, bending, etc. of the terminal 331 can be also effectively prevented even in such a punching terminal while connection reliability is improved.

Further, no predetermined height is limited to a height at which each terminal 331 mentioned above does not come in direct contact with the corresponding land 311. In addition to this height, effects similar or corresponding to those of the above case can be also expected at a predetermined height at which the terminal 331 and the land 311 are mutually separated (specifically, the terminal 331 is slightly floated with respect to the land 311) in a state before melting of the solder 312, and the terminal 331 is sunk with respect to the solder 312 and slightly comes in contact with the land 311 at a time point for setting a melting state. Otherwise, effects similar or corresponding to those of the above case can be also expected at a predetermined height at which the terminal 331 slightly comes in contact with the land 311 in the state before the melting of the solder 312.

Further, no terminal 331 is limited to the punching terminal. For example, a bending terminal may be also adopted. In the case of the bending terminal, the elastic deforming amount of the bending terminal is greater than that of the punching terminal, but shape dispersion every terminal 331 is large. Accordingly, it is preferable to position the terminal 331 at a predetermined height with respect to the land 311 such that all the terminals 331 come in contact with the solder 312 on the corresponding lands, i.e., the terminals are pressed against the lands. In the case of the bending terminal 331, it is possible to dissolve the above problem of stress due to pressing by elastically deforming the terminal itself.

Further, this embodiment mode shows an example in which the spring portion 334a of the fixing pin 334 is constructed as a nip spring branched into two portions in a predetermined range from the tip. However, no construction of the spring portion 334a is limited to the above example. The spring portion 334a may be also constructed from plural members. If the spring portion 334a has a mode in which the tip has a shape and a size able to be inserted into the through hole 313, and is elastically deformed and inserted into the through hole 313, and this deformation is released after passing-through, and the tip comes in contact with (i.e., is engaged with) the rear face of the print board 310, this mode can be adopted.

Second Embodiment Mode

Figure 5A:
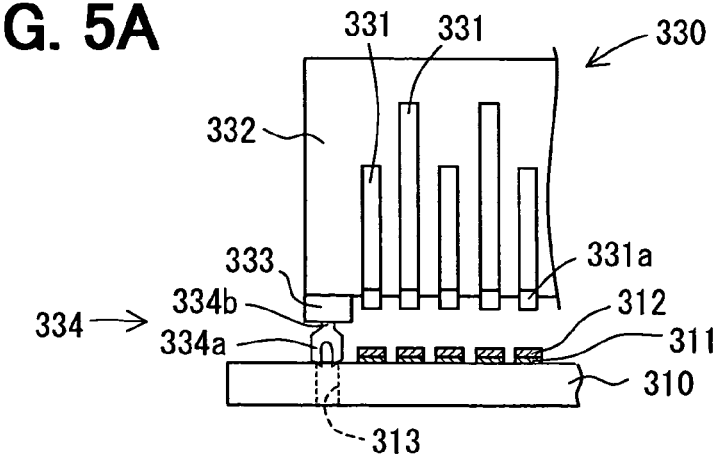
Figure 5B:
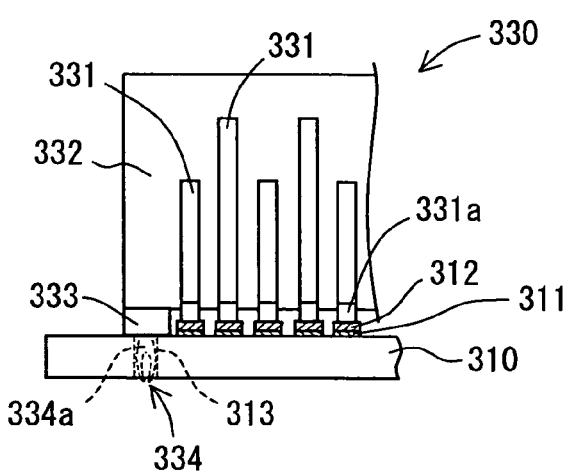
Figure 5C:
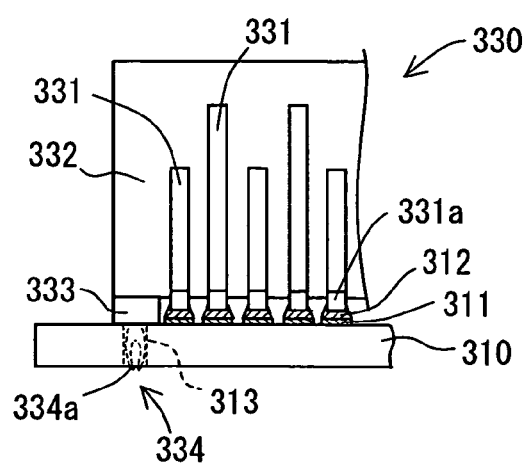

Next, a second embodiment mode of the present invention will be explained on the basis of FIGS. 5A to 5C. FIGS. 5A to 5C are typical views showing a mounting method of the connector 330 to the print board 310 in accordance with the second embodiment mode. FIGS. 5A and 5B are views showing a positioning fixation process. FIG. 5C is a view showing a joining process. FIGS. 5A to 5C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the second embodiment mode are common to those of the first embodiment mode in many portions. Accordingly, in the following description, detailed explanations of the common portions are omitted and different portions will be preponderantly explained.

The first embodiment mode shows an example in which the print board 310 is nipped and supported by the support portion 333 and the fixing pin 334 by making the fixing pin 334 as a fixing means come in contact with the rear face of the print board 310, and the positioning state is fixed. In contrast to this, this embodiment mode is characterized in that the positioning state is fixed by making the fixing pin 334 as a fixing means come in contact with an inner circumferential face of the through hole 313 formed in the print board 310.

As shown in FIGS. 5A to 5C, the basic structure and mounting method are similar to those of the first embodiment mode. The second embodiment mode differs from the first embodiment mode in the length of the fixing pin 334 projected from the housing 332 (specifically, support portion 333). Concretely, the length of the connecting portion 334b is adjusted. Concretely, as shown in FIG. 5B, at least one portion of the spring portion 334a is arranged within the through hole 313 in a state in which the support portion 333 comes in contact with the surface of the print board 310. The adjustment is made so as to come in contact with an inner wall face of the through hole 313 by reaction force of elastic deformation. Namely, when the terminal 331 is positioned and fixed (i.e., when the connector 330 is positioned and fixed to the print board 310), the positioning in a thickness direction is performed by the support portion 334, and the positioning in a planar direction is performed by the fixing pin 334 coming in contact with the inner wall face of the through hole 313. Both the positioning states are fixed by the fixing pin 334.

Thus, effects similar to those of the first embodiment mode can be also expected by the mounting structure and the mounting method of the connector 330 in accordance with this embodiment mode.

This embodiment mode shows an example in which the length of the connecting portion 334b is adjusted so as to arrange the spring portion 334a within the through hole 313 in the positioning state. However, no construction of the fixing pin 334 is limited to the above example. A construction having no connecting portion 334b and projecting only the spring portion 334a from the housing 332 (specifically, the support portion 333) may be also set.

Third Embodiment Mode

Figure 6A:
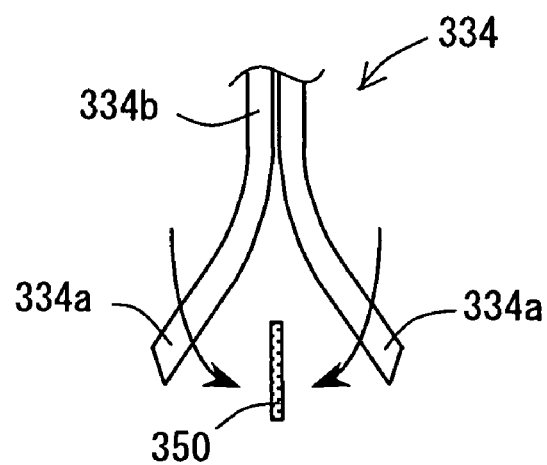
FIGS. 6A and 6B are views for explaining the construction of a fixing pin in accordance with a third embodiment mode.
Figure 6B:
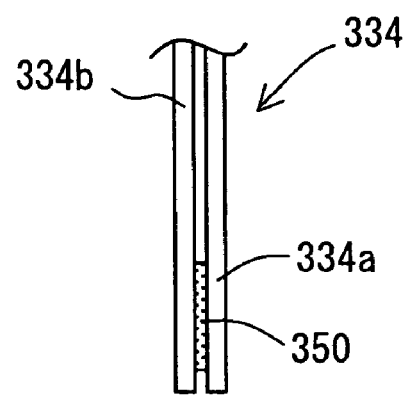
Figure 7A:
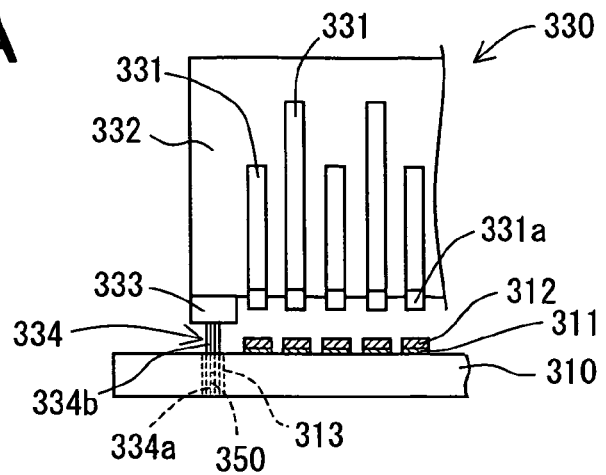
Figure 7B:
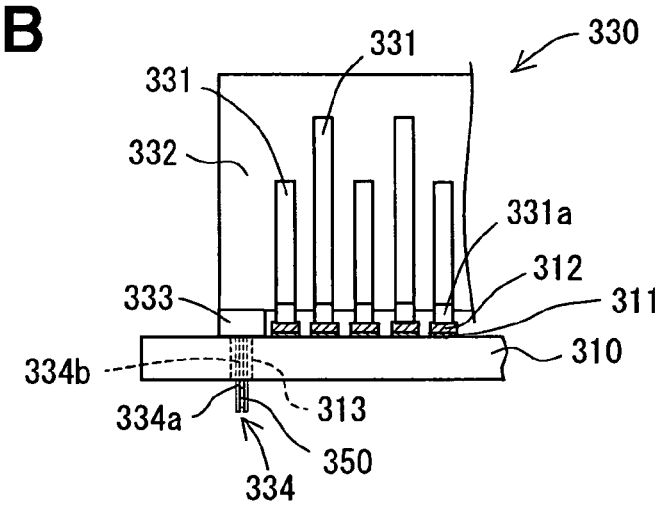
Figure 7C:
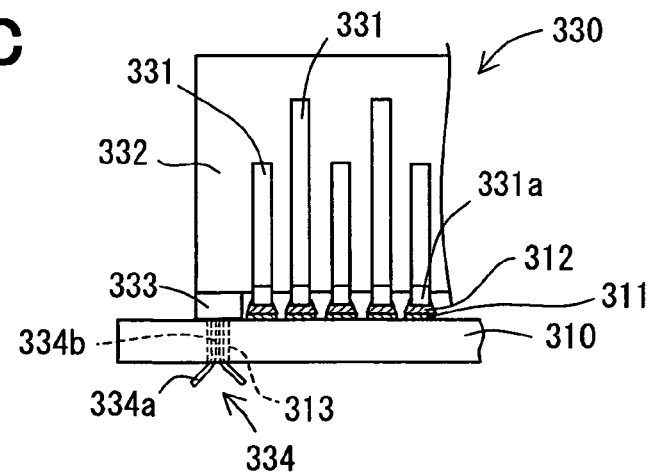

Next, a third embodiment mode of the present invention will be explained on the basis of FIGS. 6A to 7C. FIGS. 6A and 6B are views for explaining the construction of a fixing pin 334 in accordance with the third embodiment mode. FIGS. 7A to 7C are typical views showing a mounting method of the connector 330 to the print board 310 in accordance with the third embodiment mode. FIGS. 7A and 7B are views showing a positioning fixation process. FIG. 7C is a view showing the positioning fixation process and a joining process. FIGS. 7A to 7C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the third embodiment mode are common to those of the first and second embodiment modes in many portions. Accordingly, in the following description, detailed explanations of the common portions are omitted and different portions will be preponderantly explained.

The first and second embodiment modes show an example in which the thickness direction and the planar direction of the connector 330 (specifically, terminal 331) with respect to the print board 310 are positioned and the solder 312 is reflowed in a fixing state of this positioning state. In contrast to this, this embodiment mode is characterized in that the positioning state is fixed and joining is performed before the solder 312 is cooled and solidified during the reflow.

As shown in FIGS. 6A and 6B, a fixing pin 334 in accordance with this embodiment mode is constructed by two plate-shaped members, and each spring portion 334a elastically deformed by applying pressure is fixed by using an adhesive 350 so that insertion into the through hole 313 can be performed. In this embodiment mode, a material melted at a melting point of the solder 312 or less is adopted as the adhesive 350.

As shown in FIG. 7A, the fixing pin 334 constructed in this way is inserted into the through hole 313. As shown in FIG. 7B, the support portion 333 comes in contact with the surface of the print board 310. The reflow is then executed in this state. Thus, the adhesive 350 is melted and the spring portion 334a is intended to be originally returned, or is returned to the original shape until at least the solder 312 is cooled and solidified. As shown in FIG. 7C, the spring portion 334a then comes in contact (is engaged) with the rear face (including a corner portion of the through hole 313) of the print board 310. Namely, a positioning state of the thickness direction using the support portion 333 and a positioning state of the planar direction using the connecting portion 334b of the fixing pin 334 are fixed by a nipping support structure of the support portion 333 and the fixing pin 334 (specifically, spring portion 334a). The solder 312 is then cooled and solidified in a fixing state of both the positioning states, and the terminal 331 (specifically, joining portion 331a) and the corresponding land 311 can be joined through the solder 312.

Thus, effects similar or corresponding to those of the first and second embodiment modes can be also expected by the mounting method of the connector 330 in accordance with this embodiment mode.

Further, in this embodiment mode, it is not necessary to push and advance the spring portion 334a within the through hole 313 while the spring portion 334a is elastically deformed. Accordingly, the fixing pin 334 is easily inserted into the through hole 313 in comparison with the constructions shown in the first and second embodiment modes.

Further, in the case of this embodiment mode, the insertion can be also performed even in a shape in which no fixing pin 334 can be inserted into the through hole 313 in a state having no adhesive 350. Namely, a selecting item of the construction of the fixing pin 334 can be widened.

This embodiment mode shows an example for adopting a material melted at the melting point of the solder 312 or less as the adhesive 350. However, if it is a material melted at a temperature equal to or lower than a peak temperature (i.e., maximum temperature) during the reflow, this material can be adopted since the positioning state can be fixed until the solder 312 is cooled and solidified. It is preferable to suitably select the adhesive 350 so as to secure the contact state of the terminal 331 and the solder 312 in accordance with the constructional material of the print board 310 and the constructional material of the housing 332.

Further, similar to the first embodiment mode, this embodiment mode shows an example in which the spring portion 334a comes in contact with the rear face of the print board 310. However, similar to the second embodiment mode, this embodiment mode can be also applied in a construction in which the spring portion 334a comes in contact with the inner circumferential face of the through hole 313.

Further, this embodiment mode shows an example for constructing the fixing pin 334 by two members. However, the construction (i.e., the number and shape of constructional members) of the fixing pin 334 is not limited to the above example.

Further, this embodiment mode shows an example for melting the adhesive 350 by heating during the reflow. However, the reflow can be also executed after the adhesive 350 is melted by processing (heating processing, etc.) different from the reflow.

Fourth Embodiment Mode

Figure 8A:
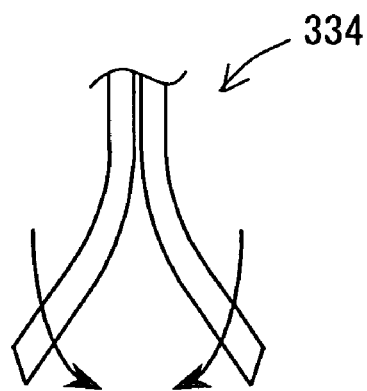
FIGS. 8A and 8B are views for explaining the construction of a fixing pin in accordance with a fourth embodiment mode.
Figure 8B:
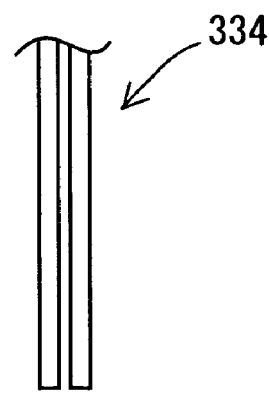
Figure 9A:
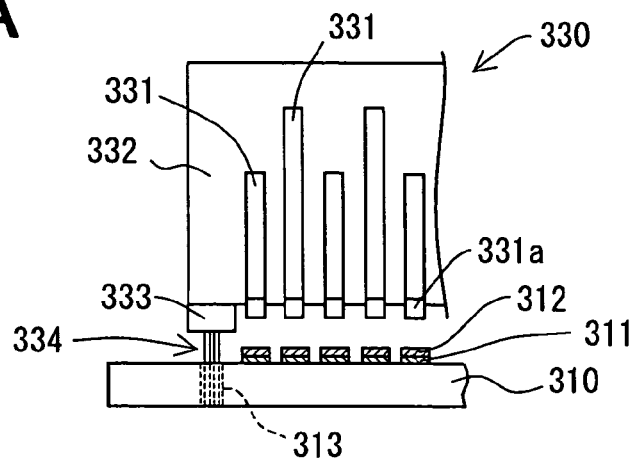
Figure 9B:
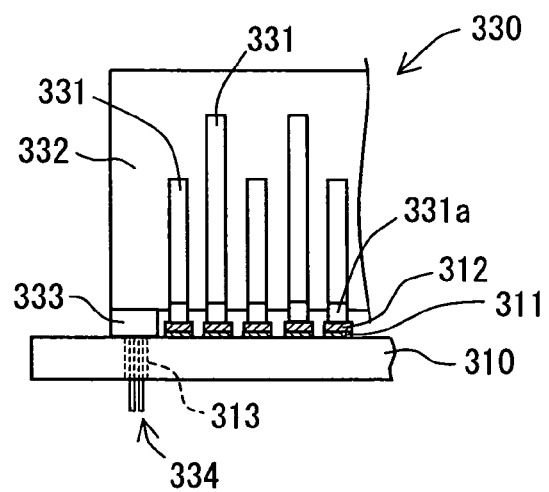
Figure 9C:
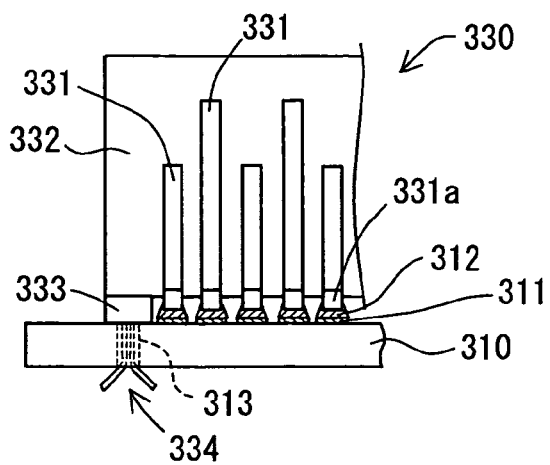

Next, a fourth embodiment mode of the present invention will be explained on the basis of FIGS. 8A to 9C. FIGS. 8A and 8B are views for explaining the construction of a fixing pin 334 in accordance with the fourth embodiment mode. FIGS. 9A to 9C are typical views showing a mounting method of the connector 330 to the print board 310 in accordance with the fourth embodiment mode. FIGS. 9A and 9B are views showing a positioning fixation process. FIG. 9C is a view showing the positioning fixation process and a joining process. FIGS. 9A to 9C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the fourth embodiment mode are common to those of the third embodiment mode in many portions. Accordingly, in the following description, detailed explanations of the common portions are omitted and different portions will be preponderantly explained.

The third embodiment mode shows an example in which the spring portion 334a of the fixing pin 334 is fixed so as to be inserted into the through hole 313 by using the adhesive 350, and the positioning state is fixed by melting the adhesive 350 until the solder 312 is cooled and solidified. In contrast to this, this embodiment mode is characterized in that effects similar to those of the third embodiment mode are shown by using a shape memory alloy as a constructional material of the fixing pin 334.

The shape memory alloy has a property returned to a shape before deformation if the shape memory alloy is set to a predetermined temperature or more by heating, etc. after the deformation. Therefore, in this embodiment mode, for example, as shown in FIGS. 8A and 8B, the fixing pin 334 is constructed by using two plate-shaped members formed by the shape memory alloy. Concretely, the fixing pin 334 is set to a shape coming in contact with an inner wall face of the print board 310 or the through hole 313 in a state before the deformation. Stress is applied to the fixing pin 334 of this shape so that the fixing pin 334 is deformed in a shape able to be inserted into the through hole 313. A material originally returned at the temperature of a melting point of the solder 312 or less is adopted as the shape memory alloy.

As shown in FIG. 9A, the fixing pin 334 constructed in this way is inserted into the through hole 313. As shown in FIG. 9B, the support portion 333 comes in contact with the surface of the print board 310. Reflow is then executed in this state. Thus, the deformation of the fixing pin 334 is released at a predetermined temperature until at least the solder 312 is cooled and solidified. The fixing pin 334 is then intended to be returned to the original shape, or is returned to the original shape. As shown in FIG. 9C, the fixing pin 334 comes in contact (is engaged) with the rear face (including a corner portion of the through hole 313) of the print board 310. Namely, a positioning state of the thickness direction using the support portion 333 and a positioning state of the planar direction using the fixing pin 334 are fixed by a nipping support structure of the support portion 333 and the fixing pin 334. The solder 312 is then cooled and solidified in a fixing state of both the positioning states. As shown in FIG. 9C, the terminal 331 (specifically, joining portion 331a) and the corresponding land 311 can be joined through the solder 312.

Thus, effects similar or corresponding to those of the first and second embodiment modes can be also expected by the mounting structure and the mounting method of the connector 330 in accordance with this embodiment mode.

Further, in this embodiment mode, it is not necessary to push and advance the spring portion 334a within the through hole 313 while the spring portion 334a is elastically deformed as shown in the first and second embodiment modes. Accordingly, the fixing pin 334 is easily inserted into the through hole 313 in comparison with the constructions shown in the first and second embodiment modes.

Further, in the case of this embodiment mode, the fixing pin 334 can be also inserted even in a shape unable to be inserted into the through hole 313 in a state before deformation. Namely, a selecting item of the construction of the fixing pin 334 can be widened.

This embodiment mode shows an example for adopting a material originally returned at the temperature of a melting point of the solder 312 or less as a shape memory alloy constituting the fixing pin 334. However, if it is a material originally returned at the temperature of a peak temperature (i.e., maximum temperature) or less during the reflow, the positioning state can be fixed until the solder 312 is cooled and solidified. Accordingly, this material can be adopted. It is preferable to use a material originally returned within the range of a temperature higher than a using upper limit temperature (e.g., 130° C.) of the electronic controller 100, and equal to or less than a melting point temperature of the solder 312. In this case, the positioning state can be fixed until the solder 312 is melted, and the fixing state can be preferably maintained at a using time of the electronic controller 100. Temperature or more originally returned and temperature less than this originally returned temperature are slightly different in the shape (e.g., an inclination angle with respect to the rear face of the print board 310) of the fixing pin 334 originally returned from the deformation. Further, in a high temperature area (e.g., 100° C. or more) of the using temperature of the electronic controller 100, stress is caused in the joining portion of the terminal 331 and the land 311 by a difference in coefficient of thermal expansion between the print board 310 and the housing 332. Therefore, a material originally returned at the using upper limit temperature of the electronic controller 100 or less may be also used. In this case, the stress of the above joining portion is relaxed and connection reliability can be also improved by a slight change of the shape of the fixing pin 334.

Further, similar to the first embodiment mode, this embodiment mode shows an example in which the fixing pin 334 comes in contact with the rear face of the print board 310. However, similar to the second embodiment mode, the fixing pin 334 shown in this embodiment mode can be also applied even in a construction coming in contact with an inner wall face of the through hole 313.

Further, this embodiment mode shows an example for constructing the fixing pin 334 by two members formed by the shape memory alloy. However, the construction (the number and shape of constructional members) of the fixing pin 334 is not limited to the above case.

Further, this embodiment mode shows an example for returning the fixing pin 334 to the original shape by heating during the reflow. However, the reflow can be also executed after the fixing pin 334 is returned to the original shape by processing (heating processing, etc.) different from the reflow.

Fifth Embodiment Mode

Figure 10A:
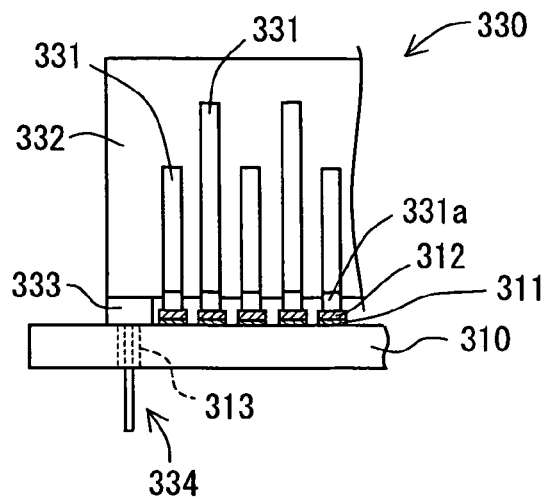
Figure 10B:
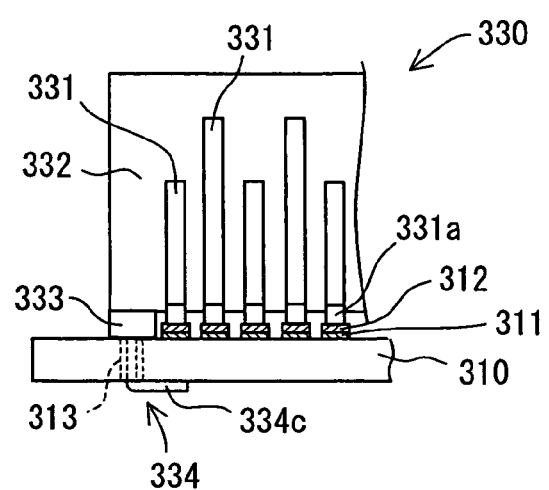
Figure 10C:
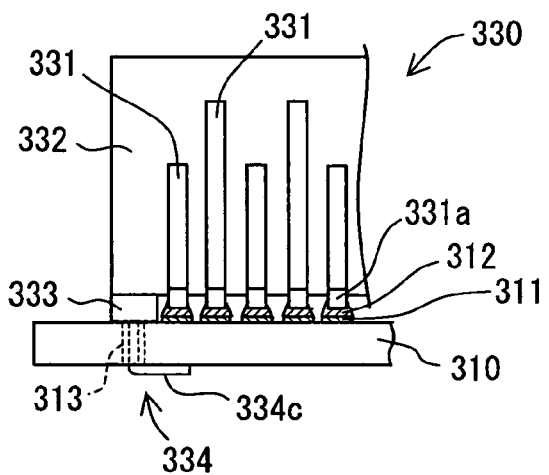
Figure 11:
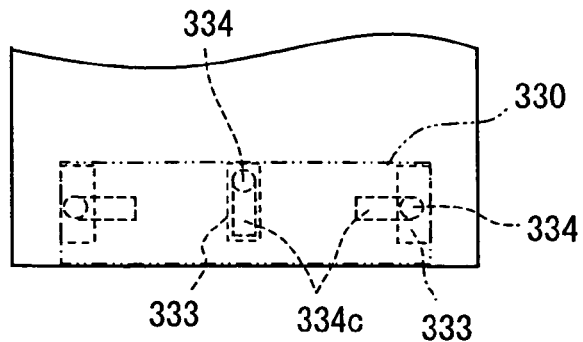
FIG. 11 is a typical view showing a bending direction of a bending part.

Next, a fifth embodiment mode of the present invention will be explained on the basis of FIGS. 10A to 10C and 11. FIGS. 10A to 10C are typical views showing a mounting method of the connector 330 to the print board 310 in accordance with the fifth embodiment mode. FIGS. 10A and 10B are views showing a positioning fixation process. FIG. 10C is a view showing a joining process. FIG. 11 is a typical view showing a bending direction of a bending part. FIGS. 10A to 10C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the fifth embodiment mode are common to those of the first embodiment mode in many portions. Accordingly, in the following description, detailed explanations of the common portions are omitted and different portions will be preponderantly explained.

The first embodiment mode shows an example in which the spring portion 334a constituting the fixing pin 334 passes through the through hole 313 and is intended to be returned to the original shape, or is returned to the original shape so that the spring portion 334a comes in contact with the rear face of the print board 310. In contrast to this, this embodiment mode is characterized in that the spring portion 334a comes in contact with the rear face of the print board 310 by bending the fixing pin 334 of a bar shape or a plate shape.

As shown in FIG. 10A, the fixing pin 334 in accordance with this embodiment mode is constructed by one bar-shaped member so as to be inserted into the through hole 313 in a state before bending. The fixing pin 334 constructed in this way is inserted into the through hole 313 as shown in FIG. 10A, and the support portion 333 comes in contact with the surface of the print board 310. In this state, as shown in FIG. 10B, at least one portion of a part (i.e., a part projected on the rear face side of the print board 310) passing through the through hole 313 on the rear face side is bent so as to come in contact with the rear face of the print board 310. This bent part is set to a bending part 334c. Namely, the connector 330 is positioned by the support portion 333 with respect to the print board 310 in the thickness direction. Further, the connector 330 is positioned by the fixing pin 334 arranged in the through hole 313 with respect to the print board 310 in the planar direction. Further, the print board 310 is nipped and supported by the support portion 333 and the bending part 334c of the fixing pin 334, and both the above positioning states are fixed. Accordingly, it is possible to secure a mode in which each terminal 331 comes in contact with the solder 312 arranged on the corresponding land by this positioning fixation.

Similar to the first embodiment mode, the reflow is then executed in this positioning fixation state. As shown in FIG. 10c, the terminal 331 (specifically, the joining portion 331a) and the corresponding land 311 are joined through the solder 312.

Thus, effects similar to those of the first embodiment mode can be also expected by the mounting structure and the mounting method of the connector 330 in accordance with this embodiment mode.

It is necessary to bend the fixing pin 334 in the case of the fixing pin 334 in accordance with this embodiment mode. Accordingly, the number of works is increased in comparison with a case adopting the fixing pin 334 shown in the first embodiment mode. However, since the fixing pin 334 is bent after the fixing pin 334 passes through the through hole 313, a contact area of the bending part 334c and the rear face of the print board can be increased in comparison with the fixing pin 334 shown in the first embodiment mode. Accordingly, for example, as shown in FIGS. 10B and 10C and FIG. 11, a connector mounting area of the print board 310 can be more rigidly fixed if the bending part 334c is bent so as to come in contact with the rear face of a mounting part of the connector 330. Namely, deformation (i.e., warp) of the print board 310 and the housing 332 can be further reduced, and connection reliability can be raised. In particular, when the bending part 334c is bent in a gravity center direction of the connector 330, it is more effective in deformation restraint of the print board 310 due to the weight of the housing 332.

Sixth Embodiment Mode

Figure 12:
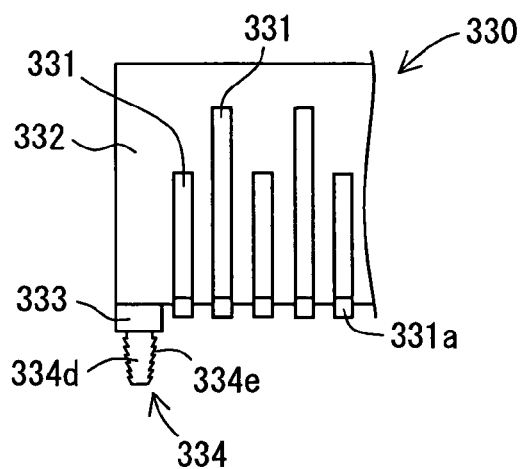
FIG. 12 is a view for explaining the construction of a fixing pin in accordance with a sixth embodiment mode.
Figure 13A:
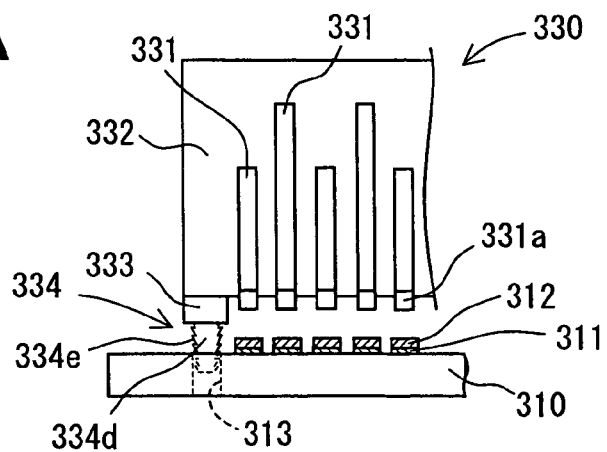
Figure 13B:
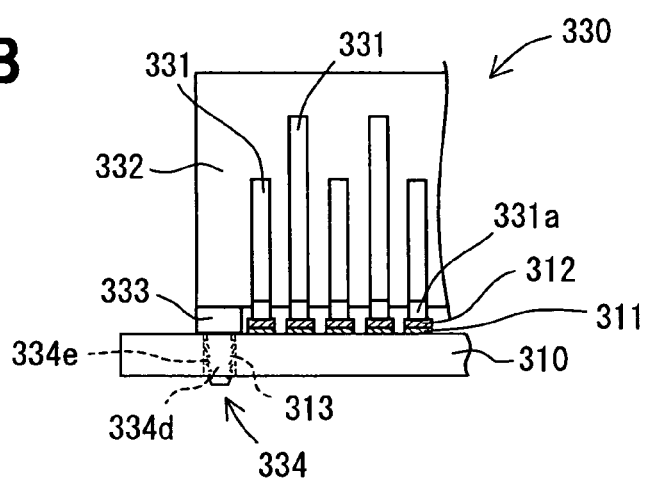
Figure 13C:
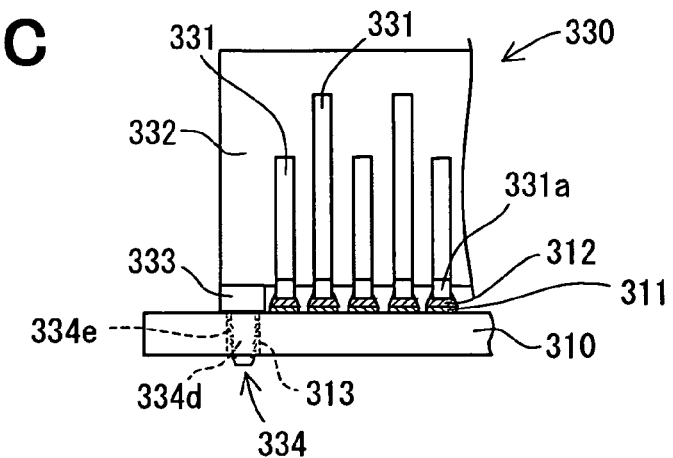

Next, a sixth embodiment mode of the present invention will be explained on the basis of FIGS. 12 and 13A to 13C. FIG. 12 is a view for explaining the construction of a fixing pin 334 in accordance with the sixth embodiment mode. FIGS. 13A to 13C are typical views showing a mounting method of the connector 330 to the print board 310 in accordance with the sixth embodiment mode. FIGS. 13A and 13B are views showing a positioning fixation process. FIG. 13C is a view showing a joining process. FIGS. 13A to 13C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the sixth embodiment mode are common to those of the second embodiment mode in many portions. Accordingly, in the following description, detailed explanations of the common portions are omitted and different portions will be preponderantly explained.

The second embodiment mode shows an example in which the spring portion 334a constituting the fixing pin 334 comes in contact with the inner wall face of the through hole 313, and the positioning state is fixed by reaction force of elastic deformation. In contrast to this, this embodiment mode is characterized in that the fixing pin 334 includes a diametrical enlarging portion diametrically enlarged from a projection tip to the housing side, and the positioning state is fixed by making this diametrical enlarging portion come in contact with the inner wall face of the through hole 313.

As shown in FIG. 12, one portion of the fixing pin 334 is fixed to the housing 332 (specifically, the support portion 333). The fixing pin 334 is set to a shape and a size at which a projection tip from the support portion 333 can be inserted into the through hole 313. In this embodiment mode, the fixing pin 334 is constructed by a material different from that of the support portion 333, and is partially buried and fixed to the support portion 333. Further, a predetermined range from the projection tip is constructed as a diametrical enlarging portion 334d diametrically enlarged on the housing side. Accordingly, the fixing pin 334 can be inserted (i.e., press-fitted) into the through hole 313 from the projection tip, and the positioning state can be fixed by frictional force with respect to the through hole 313. In this embodiment mode, a portion projected from the support portion 333 is constructed as the diametrical enlarging portion 334d. Further, plural projections 334e projected in a direction reverse to an insertion direction into the through hole 313 are arranged on the surface of the diametrical enlarging portion 334d. Accordingly, coming-out of the fixing pin 334 on the surface side of the print board 310 can be more effectively prevented. Namely, the positioning state can be fixed.

The fixing pin 334 constructed in this way is inserted into the through hole 313 as shown in FIG. 13A. As shown in FIG. 13B, the support portion 333 comes in contact with the surface of the print board 310. Thus, the connector 330 is positioned with respect to the print board 310 in the thickness direction. Further, in a state in which the support portion 333 comes in contact with the surface of the print board 310, the surface of the diametrical enlarging portion 334d of the fixing pin 334 comes in contact with the inner wall face of the through hole 313, and the connector 330 is positioned with respect to the print board 310 in the planar direction. Further, the projection 334e of the surface of the diametrical enlarging portion 334d comes in contact with the inner wall face of the through hole 313 so as to show large resistance force with respect to the coming-out on the surface side of the print board 310. Namely, both the above positioning states are fixed by frictional force of the diametrical enlarging portion 334d with respect to the inner wall face of the through hole 313 adding an effect of this projection 334e. Accordingly, it is possible to secure a mode in which each terminal 331 comes in contact with the solder 312 arranged on the corresponding land by this positioning fixation.

Similar to the second embodiment mode, the reflow is then executed in this positioning fixation state, and the terminal 331 (specifically, the joining portion 331a) and the corresponding land 311 are joined through the solder 312 as shown in FIG. 13C.

Thus, effects similar to those of the second embodiment mode can be also expected by the mounting structure and the mounting method of the connector 330 in accordance with this embodiment mode.

This embodiment mode shows an example for arranging plural projections 334e on the surface of the diametrical enlarging portion 334d. However, a construction having no projection 334e can be also adopted. Further, it is not limited to the projection 334e as a construction for increasing frictional force with respect to the inner wall face of the through hole 313.

Seventh Embodiment Mode

Figure 14:
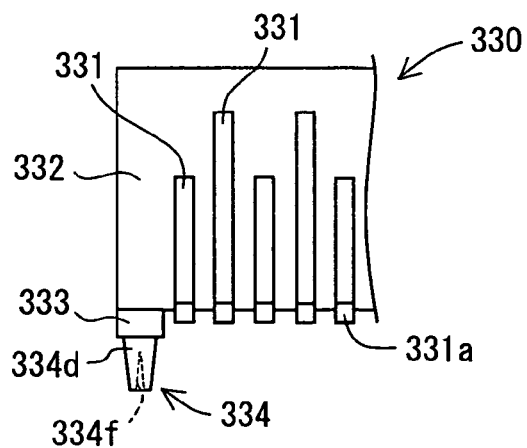
FIG. 14 is a view for explaining the construction of a fixing pin in accordance with a seventh embodiment mode.
Figure 15A:
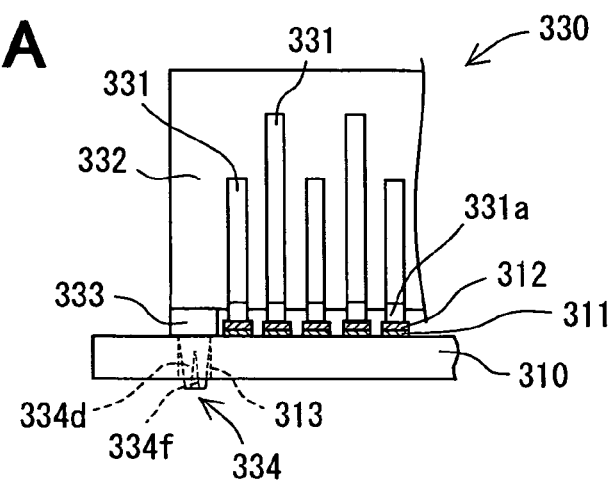
Figure 15B:
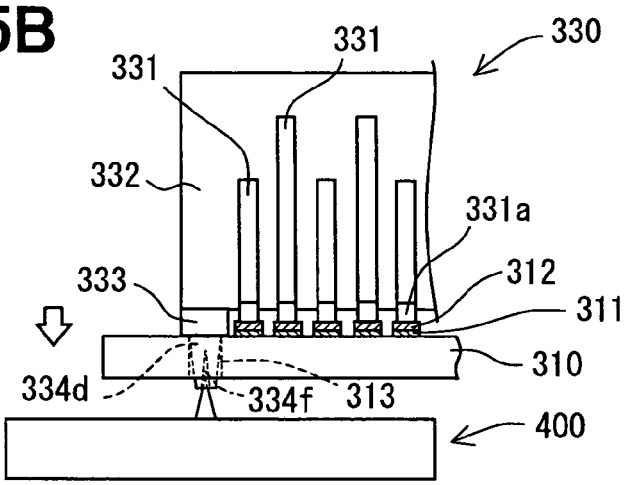
Figure 15C:
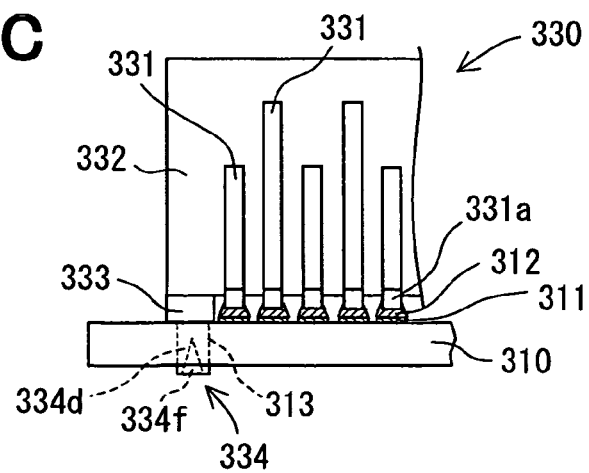

Next, a seventh embodiment mode of the present invention will be explained on the basis of FIGS. 14 and 15A to 15C. FIG. 14 is a view for explaining the construction of a fixing pin 334 in accordance with the seventh embodiment mode. FIGS. 15A to 15C are typical views showing a mounting method of the connector 330 to the print board 310 in accordance with the seventh embodiment mode. FIGS. 15A and 15B are views showing a positioning fixation process. FIG. 15C is a view showing a joining process. FIGS. 15A to 15C also illustrate the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the seventh embodiment mode are common to those of the sixth embodiment mode in many portions. Accordingly, in the following description, detailed explanations of the common portions are omitted and different portions will be preponderantly explained.

The sixth embodiment mode shows an example in which the fixing pin 334 includes the diametrical enlarging portion 334d diametrically enlarged on the housing side from the projection tip, and the positioning state is fixed by making this diametrical enlarging portion 334d come in contact with the inner wall face of the through hole 313. In contrast to this, this embodiment mode is characterized in that a groove portion is arranged in the diametrical enlarging portion 334d, and the diametrical enlarging portion 334d is opened by inserting a jig into this groove portion 334d, and a contact area with the inner wall face of the through hole 313 is increased.

As shown in FIG. 14, similar to the fixing pin 334 of the sixth embodiment mode, one portion of the fixing pin 334 is fixed to the housing 332 (specifically, the support portion 333). The fixing pin 334 is set to a shape and a size at which a projection tip from the support portion 333 can be inserted into the through hole 313. In this embodiment mode, the fixing pin 334 is also constructed by a material different from that of the support portion 333, and is partially buried and fixed to the support portion 333. Further, a predetermined range from the projection tip is constructed as the diametrical enlarging portion 334d diametrically enlarged on the housing side. A groove 334f of a predetermined depth is arranged from the projection tip to the housing side in the diametrical enlarging portion 334d in accordance with this embodiment mode. The diametrical enlarging portion 334d is constructed such that the projection tip side is opened (i.e., diametrically enlarged) by inserting a jig into the groove 334f in comparison with a case prior to the insertion.

As shown in FIG. 15A, the fixing pin 334 constructed in this way is inserted into the through hole 313, and the support portion 333 comes in contact with the surface of the print board 310. Thus, the connector 330 is positioned with respect to the print board 310 in the thickness direction. In this state, as shown in FIG. 15B, the jig 400 is inserted into the groove 334f, and it is set to a state for opening the projection tip side of the diametrical enlarging portion 334d. Thus, the connector 330 is positioned with respect to the print board 310 in the planar direction. Further, a contact area of the fixing pin 334 (specifically, the diametrical enlarging portion 334d) and the inner wall face of the through hole 313 is increased, and no fixing pin 334 easily comes out of the through hole 313 on the surface side of the print board 310 by its frictional force so that both the above positioning states are fixed. Accordingly, it is possible to secure a mode in which each terminal 331 comes in contact with the solder 312 arranged on the corresponding land by this positioning fixation.

Similar to the sixth embodiment mode, the reflow is then executed in this positioning fixation state. As shown in FIG. 15C, the terminal 331 (specifically, the joining portion 331a) and the corresponding land 311 are joined through the solder 312.

Thus, effects similar or corresponding to those of the sixth embodiment mode can be also expected by the mounting structure and the mounting method of the connector 330 in accordance with this embodiment mode.

Eighth Embodiment Mode

Figure 16A:
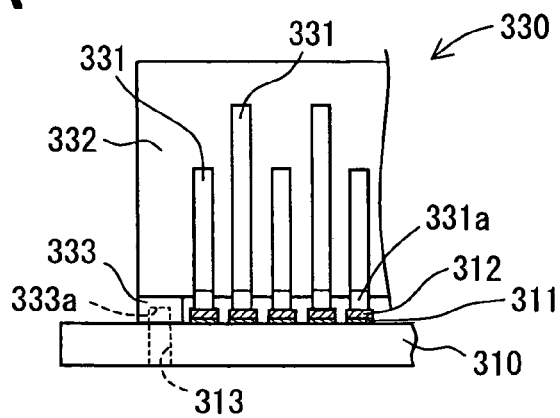
Figure 16B:
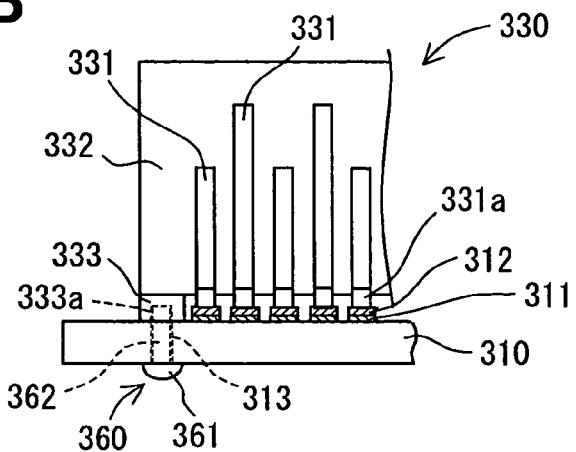
Figure 16C:
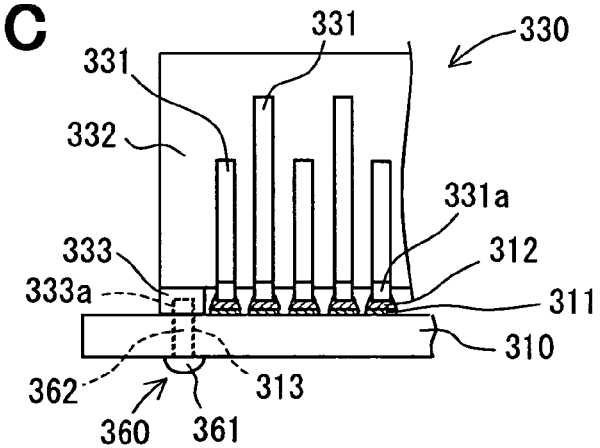

Next, an eighth embodiment mode of the present invention will be explained on the basis of FIGS. 16A to 16C. FIGS. 16A to 16C are typical views showing a mounting method of the connector 330 to the print board 310 in accordance with the eighth embodiment mode. FIGS. 16A and 16B are views showing a positioning fixation process. FIG. 16C is a view showing a joining process. FIGS. 16A to 16C also illustrate the through hole 313 (specifically, a screw within the through hole) of the print board 310 and a screw hole of the support portion 333 not located on the same straight line as the land 311 (specifically, the joining portion 331a of the terminal 331) for convenience of the explanation.

The mounting structure and the mounting method of the connector 330 in the eighth embodiment mode are common to those of the first embodiment mode in many portions. Accordingly, in the following description, detailed explanations of the common portions are omitted and different portions will be preponderantly explained.

The first embodiment mode shows an example for adopting the fixing pin 334 partially fixed to the housing 332 (specifically, the support portion 333) as a fixing means. In contrast to this, as shown in FIG. 16B, this embodiment mode is characterized in that a screw 360 constructed by a head portion 361 and a columnar portion 262 connected to this head portion 361 is adopted as the fixing means. A material for releasing no positioning fixation state by the reflow can be adopted as a constructional material of the screw 360.

As shown in FIG. 16A, a through hole 313 passing through a portion between the surface and the rear face is arranged in the print board 310 correspondingly to the screw 360. A screw hole 333a screwed to a predetermined range from a tip of the columnar portion 362 is arranged in the housing 332 (specifically, the support portion 333) correspondingly to the screw 360. The diameter of the through hole 31 is set to be approximately equal to or slightly smaller than the diameter of the columnar portion of the screw 360. In this embodiment mode, the connector 330 is placed on the print board 310 such that the support portion 333 comes in contact with the surface of the print board 310 so as to align the through hole 313 and the screw hole 333a in a state before the screw 360 is inserted into the through hole 313. Thus, the connector 330 is positioned with respect to the print board 310 in the thickness direction. Next, as shown in FIG. 16B, the screw 360 is inserted into the through hole 313 from the rear face side of the print board 310, and is screwed to the screw hole 333a through the through hole 313. Thus, the connector 330 is positioned with respect to the print board 310 in the planar direction. Further, both the above positioning states are fixed. Accordingly, it is possible to secure a mode in which each terminal 331 comes in contact with the solder 312 arranged on the corresponding land by this positioning fixation.

Similar to the first embodiment mode, the reflow is then executed in this positioning fixation state. As shown in FIG. 16C, the terminal 331 (specifically, the joining portion 331a) and the corresponding land 311 are joined through the solder 312.

Thus, effects similar to those of the first embodiment mode can be also expected by the mounting structure and the mounting method of the connector 330 in accordance with this embodiment mode.

Further, in the case of screw fastening, the connector 330 can be more rigidly fixed to the print board 310 in comparison with the fixing pin 334. Namely, connection reliability can be further improved.

The reflow of the electronic part 320 and the reflow of the connector 330 may be also executed in different timings, and may be also collectively executed. First, when the reflow of the electronic part 320 is early executed and the connector 330 is then positioned and fixed to the print board 310 by the support portion 333 and the screw 360 and the reflow of the terminal 331 is locally executed, no vibration due to the screw fastening of the connector 330 is given to the electronic part 320 before joining so that a position shift of the electronic part 320 can be prevented. In contrast to this, the number of works can be reduced when the connector 330 is positioned and fixed to the print board 310 by the support portion 333 and the screw 360, and the electronic part 320 is collectively reflowed together with the terminal 331.

Ninth Embodiment Mode

Figure 17A:
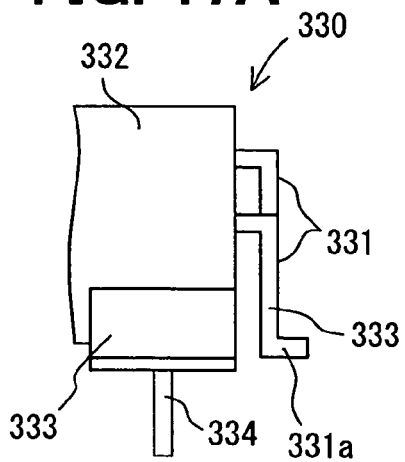
Figure 17B:
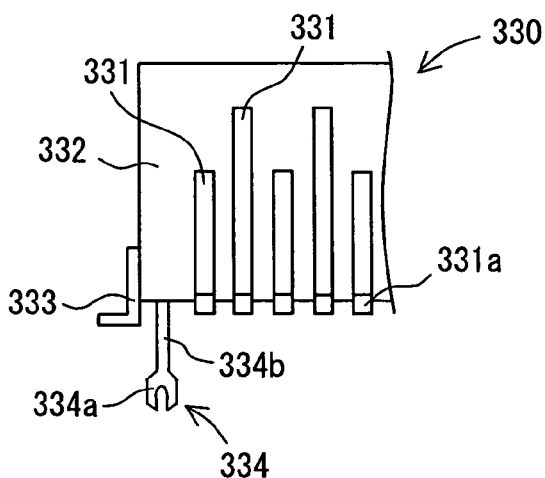
Figure 18:
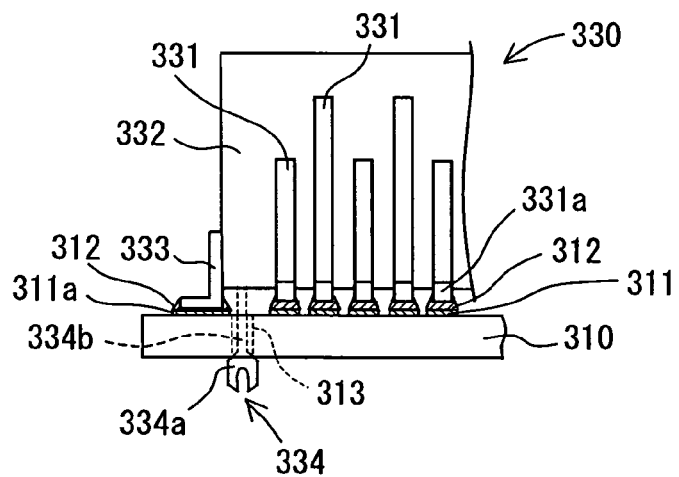
FIG. 18 is a typical view showing a mounting structure of the connector to a print board in accordance with the ninth embodiment mode.

Next, a ninth embodiment mode of the present invention will be explained on the basis of FIGS. 17A-17B and 18. FIGS. 17A and 17B are views for explaining the construction of a support portion and a fixing means in accordance with the ninth embodiment mode. FIG. 17A is a side view seen from the longitudinal direction of the connector. FIG. 17B is a front view of the above construction. FIG. 18 is a typical view showing a mounting structure of the connector 330 to the print board 310 in accordance with the ninth embodiment mode. FIG. 18 also illustrates the through hole 313 (specifically, the fixing pin 334 within the through hole) of the print board 310 not located on the same straight line as the land 311 (specifically, the joining portion 331a of the terminal 331) for convenience of the explanation.

The mounting structure and the mounting method of the connector 330 in the ninth embodiment mode are common to those of the first embodiment mode in many portions. Accordingly, in the following description, detailed explanations of the common portions are omitted and different portions will be preponderantly explained.

The first embodiment mode shows an example in which the support portion 333 is constructed so as to determine a position in the thickness direction. In contrast to this, this embodiment mode is characterized in that a function for reinforcing a fixing structure for fixing the connector 330 to the print board 310 is given in addition to the above function.

As shown in FIGS. 17A and 17B, the support portion 333 is constructed by a metal of a plate shape, and is partially fixed to a part different from a fixing part of the fixing pin 334 as a fixing means in the housing 332. Namely, the fixing pin 334 is fixed to a part of the housing 332 except for the support portion 333. Concretely, similar to the first embodiment mode, the fixing pin 334 is arranged at both ends of the housing 332 in the longitudinal direction, and is also arranged between these both ends, and one portion of the support portion 333 is integrally buried and fixed to the housing 332. In this embodiment mode, a burying part is omitted in the illustration. A part of the support portion 333 projected from the housing 332 is bent such that a predetermined range from a projection tip approximately becomes parallel to the surface of the print board 310. This bent part becomes a joining portion to a corresponding dummy land. Further, the support portion 333 is constructed such that a lower face (specifically, a face opposed to the dummy land) of the support portion 333 is located below a lower face of the joining portion 331a of the terminal 331 so as not to press the terminal 331 (specifically, joining portion 331a) against the land 311 in the thickness direction. Namely, only the support portion 333 is constructed so as to come in contact with the surface of the print board 310 in placing the connector 330 in the print board 310.

The dummy land 311a is arranged in the print board 310 correspondingly to the support portion 333. Accordingly, similar to the first embodiment mode (see FIGS. 4A to 4C), in a state in which the fixing pin 334 is inserted into the through hole 313 and the support portion 333 comes in contact with the surface of the print board 310 (specifically, dummy land 311a), the spring portion 334a of the fixing pin 334 passes through the through hole 313 on the rear face side, and comes in contact (is engaged) with the rear face of the print board 310. Thus, the thickness direction of the connector 330 is positioned by the support portion 333 with respect to the print board 310. Further, the planar direction of the connector 330 is positioned by the fixing pin 334 with respect to the print board 310. Further, both the above positioning states are fixed since the print board 310 is nipped and supported by the support portion 333 and the fixing pin 334. Accordingly, it is possible to secure a mode in which each terminal 331 comes in contact with the solder 312 arranged on the corresponding land by this positioning fixation. When the reflow is executed in this positioning fixation state, as shown in FIG. 18, the terminal 331 (specifically, the joining portion 331a) and the corresponding land 311 are joined through the solder 312. Further, in this embodiment mode, the solder 312 is also arranged on the surface of the dummy land 311a, and the support portion 333 and the dummy land 311a are joined through the solder 312 together with the joining of the terminal 311 and the land 311.

Thus, effects similar to those of the first embodiment mode can be also expected by the mounting structure and the mounting method of the connector 330 in accordance with this embodiment mode.

Further, in this embodiment mode, since the support portion 333 is fixed to the print board 310, the connector 330 can be rigidly fixed to the print board 310 in comparison with a case for fixing no support portion 333. Accordingly, connection reliability can be further improved.

Further, in this embodiment mode, the support portion 333 is fixed to the print board 310 by utilizing the reflow. Accordingly, the number of works can be reduced. However, the support portion 333 may be also fixed to the surface of the print board 310 in timing different from that of the reflow. It is sufficient if the support portion 333 is fixed after positions in the thickness direction and the planar direction are performed. However, when the support portion 333 is set to be fixed until the solder 312 is cooled and solidified, position accuracy can be preferably improved.

Figure 19:
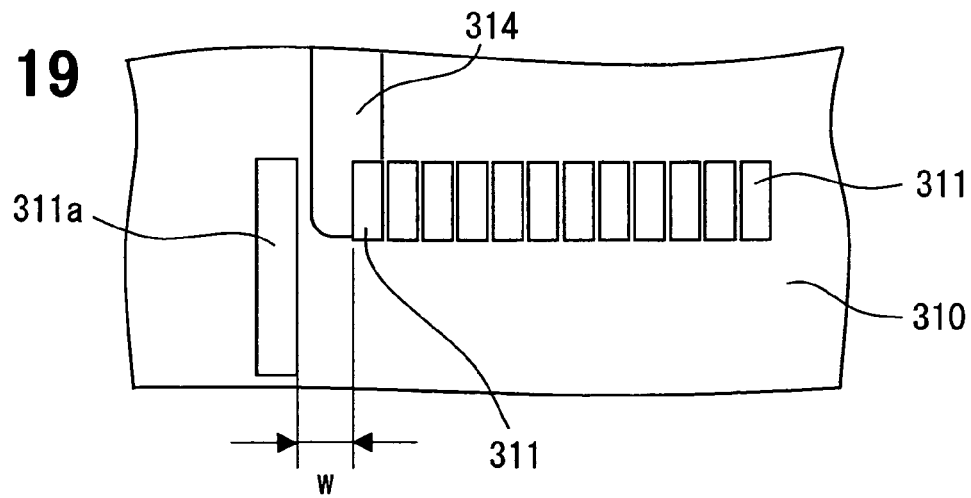
FIG. 19 is a view showing an arrangement example of a dummy land.

As shown in FIG. 19, the support portion 333 and the dummy land 311a are preferably constructed so as to secure a distance w able to arrange wiring 314 electrically connected to one land 311 in the land 311 of an end portion of the print board 310 in the longitudinal direction between this land 311 and the support portion 311a near this land. Thus, the degree of freedom of a wiring pattern is increased. In particular, when the land 311 of a power system is arranged near the end portion of the longitudinal direction in the relation of a wiring width, as shown in FIG. 19, the pattern of a large electric current can be wired by securing the distance w for passing the wiring 314 connected to the land 311 (specifically, the land 311 of the end portion in FIG. 19) of the power system between the dummy land 311a and the land 311 of the end portion. FIG. 19 is a view showing an arrangement example of the dummy land 311a. In FIG. 19, the dummy land 311a (specifically, the support portion 333) is extended until the side of a joining area of the terminal 331 from the housing 332. Thus, when the dummy land 311a (or support portion 333) is arranged on the side of the joining area of the terminal 331, the joining area of the terminal 331 can be rigidly fixed so that connection reliability can be further improved.

No shape of the support portion 333 is limited to the shape shown in this embodiment mode. Further, no fixing method of the support portion 333 with respect to the housing 332 is also limited to the shape shown in this embodiment mode. If it is a method for releasing no fixing state even at a reflow time, this method can be adopted. Further, no fixation of the support portion 333 to the print board 310 is also limited to the method shown in this embodiment mode.

Further, the support portion 333 shown in this embodiment mode can be also applied to the second to eighth embodiment modes.

Further, a construction collectively having the support portion 333 (fixed to the print board 310) shown in this embodiment mode and the support portion 333 (only coming in contact with the print board 310) shown in the first to eighth embodiment modes may be also set. Thus, connection reliability can be further improved.

The preferred embodiment modes of the present invention have been explained above. However, the present invention is not limited to the above embodiment modes, but can be variously modified and executed in the scope not departing from the features of the present invention.

This embodiment mode shows an example for applying the mounting structure and the mounting method of the connector 330 to the electronic controller constituting the electronic control unit (ECU) of the engine of a vehicle. However, its application range is not limited to the above examples. The mounting structure and the mounting method can be applied in a construction for mounting the connector 330 to the print board 310.

The first and eighth embodiment modes show an example for arranging the support portion 333 in a lower portion of the housing 332. However, the support portion 333 may be also arranged so as to come in contact with a side face of the housing 332.

The above disclosure has the following aspects.

According to a first aspect of the present disclosure, a mounting structure includes: a surface mounting connector including a housing and a plurality of terminals, wherein each terminal extends from the housing; a substrate including a plurality of lands, each of which corresponds to the terminal, wherein each land is disposed on the substrate, and wherein each land is electrically connected to the terminal with a bonding member; a plurality of support portions for supporting the connector on the substrate, wherein each support portion protrudes from the housing toward the substrate, and contacts a surface portion of the substrate; and a plurality of fixing members for fixing and positioning the connector with respect to the substrate, wherein each fixing member is connected to the housing, and contacts a part of the substrate, which is different from the surface portion of the substrate contacting the support portion. Each terminal is positioned on the substrate with a predetermined distance between the terminal and the substrate by the support portions and the fixing members.

In the above structure, the connector is positioned and fixed to the substrate by the plural support portions and the plural fixing means. Accordingly, a connector mounting area of the substrate and the housing of the connector mounted to the substrate become rigid. Therefore, it is possible to reduce deformation (warp) of the connector mounting area of the substrate and the housing due to thermal expansion at, at least, a reflow time. Further, the terminal can be positioned by the support portion and the fixing means at a predetermined height suitable for joining with respect to the substrate surface so as to abut on a joining material of a melting state. Accordingly, connection reliability of the terminal and the corresponding land can be improved. Here, "The terminal abuts on the joining material of the melting state" means that the joining material may be also secured before the melting, and may be also secured during the melting.

Alternatively, each terminal does not directly contact the land so that the terminal is coupled with the land through the bonding member. Here, when the terminal is joined in a state strongly pressed against the corresponding land, stress due to the pressing is left in the joining portion. Therefore, connection reliability is easily reduced by the action of external stress. Accordingly, it is preferable to set a predetermined height with respect to the substrate surface for positioning the terminal to a height able to improve connection reliability of the terminal and the corresponding land. In other words, the predetermined height is preferably set to a height at which the terminal can secure an electric connecting state with the corresponding land through the joining material, and no stress due to the above pressing is almost left in the joining portion of the terminal and the corresponding land in a solidifying state of the joining material. Therefore, as described in the above structure, the terminal is preferably positioned at a height coming in no direct contact with the land. In this case, the joining material is arranged between opposite faces of the terminal and the land, and a contact area with the joining material is increased. Further, since no terminal is pressed against the land (a state abutting on the joining material but slightly floated with respect to the land surface is set), no stress due to the pressing is left in the joining portion in a solidifying state of the joining material. Further, breaking, bending, etc. of the terminal can be prevented. Accordingly, connection reliability can be further improved. Effects similar or corresponding to those of the above case can be also expected at a predetermined height at which the terminal and the land are mutually separated (the terminal is slightly floated with respect to the land) in a state before melting of the joining material, and the terminal is sunk with respect to the joining material and slightly comes in contact with the land at a time point for setting a melting state. Otherwise, effects similar or corresponding to those of the above case can be also expected at a predetermined height at which the terminal slightly comes in contact with the land in the state before the melting of the joining material.

Alternatively, each fixing member is a fixing pin, which is integrated with the housing. The substrate further includes a plurality of through holes, each of which penetrates the substrate. The substrate has a first surface and a second surface. Each support portion contacts the first surface of the substrate. The fixing pin penetrates the through hole so that the fixing pin contacts the second surface of the substrate. In this case, it may be also set to a construction in which the fixing means is a fixing pin integrally arranged in the housing, a through hole passing through a portion between the surface and a rear face of the substrate is arranged in the substrate, and the fixing pin passes through the through hole and comes in contact with the rear face of the substrate in a state in which the support portion comes in contact with the surface of the substrate. In this case, when the terminal is positioned and fixed (the connector is positioned and fixed with respect to the substrate), the terminal is positioned by the fixing pin passing through the substrate in a planar direction of the substrate, and is also positioned by the support portion in a thickness direction of the substrate. The above positioning state can be fixed by nipping support using the fixing pin and the support portion. In the case of the fixing pin, it is possible to collectively perform contact of the support portion with the substrate surface, and contact of the fixing pin with the substrate rear face. Accordingly, the number of works can be reduced.

Alternatively, each fixing member is a fixing pin, which is integrated with the housing. The substrate further includes a plurality of through holes, each of which penetrates the substrate, and has an inner wall. The substrate has a first surface and a second surface. Each support portion contacts the first surface of the substrate. The fixing pin is inserted into the through hole, and the fixing pin only contacts the inner wall of the through hole. In this case, it may be also set to a construction in which the fixing means is a fixing pin integrally arranged in the housing, a through hole passing through a portion between the surface and a rear face of the substrate is arranged in the substrate, and the fixing pin is inserted into the through hole and comes in contact with an inner wall face of the substrate in a state in which the support portion comes in contact with the surface of the substrate. In this case, when the terminal is positioned and fixed (the connector is positioned and fixed with respect to the substrate), the terminal is positioned by the fixing pin inserted into the through hole in a planar direction of the substrate, and is also positioned by the support portion in a thickness direction of the substrate. The above positioning state can be fixed by the fixing pin. In the case of the fixing pin, it is possible to collectively perform contact of the support portion with the substrate surface, and contact of the fixing pin with the inner wall face of the through hole. Accordingly, the number of works can be reduced.

Alternatively, each fixing pin has a rod shape or a plate shape. The fixing pin further includes a straight portion and a bending portion. The straight portion penetrates the through hole. The bending portion is bent along with the second surface of the substrate so that the bending portion of the fixing pin contacts the second surface of the substrate. In this case, it is possible to adopt a construction in which the fixing pin has a bar shape or a plate shape, and a part passing through the through hole on the rear face side is bent and comes in contact with the rear face of the substrate. Further, the bending portion is bent toward the connector. In this case, when it is set to a construction in which the bending part coming in contact with the rear face of the substrate is bent on an arranging side of the connector in the fixing pin, the connector mounting area of the substrate can be more rigidly fixed. Namely, deformation (warp) of the substrate and the housing can be further reduced, and connection reliability can be raised. Further, the bending portion is bent toward a mass center of the connector. In this case, when the bending part is constructed so as to be bent in a gravity center direction of the connector, it is more effective in a reduction of substrate deformation due to the weight of the housing.

Alternatively, the fixing pin has a tapered portion, which expands a diameter of the through hole, and the tapered portion is disposed from a top of the fixing pin to a predetermined position of the fixing pin. In this case, it is possible to adopt a construction in which a projection tip of the fixing pin from the housing can be inserted into the through hole, and a predetermined range from the projection tip is set to a diametrical enlarging portion diametrically enlarged on the housing side. In accordance with such a construction, while positioning of the thickness direction is performed by the support portion and positioning of the planar direction is performed by the diametrical enlarging portion, the connector can be fixed to the substrate in the positioning state (the terminal can be fixed to the substrate surface at a predetermined height). Further, the tapered portion includes a plurality of protrusions. When plural projections are arranged in the diametrical enlarging portion, it is possible to set the fixing pin so as not to easily come out.

Alternatively, the fixing pin has a spring portion, which is elastically deformable, and the spring portion is disposed from a top of the fixing pin to a predetermined position of the fixing pin. In this case, it is possible to adopt a construction in which a projection tip from the housing can be inserted into the through hole, and a predetermined range from the projection tip is set to a spring portion elastically deformed so as to be inserted into the through hole. In accordance with such a construction, for example, the spring portion passing through the through hole is opened from a deforming state and comes in contact with the rear face of the substrate, and can fix the positioning state by nipping support with respect to the support portion. Further, the spring portion inserted into the through hole comes in contact with the through hole by reaction force elastically deformed, and can fix the positioning state.

Alternatively, the fixing pin is made of shape-memory alloy. In this case, the fixing pin may be also constructed by using a shape memory alloy. The shape memory alloy has a property returned to a shape before deformation if the shape memory alloy is set to a predetermined temperature or more by heating, etc. after the deformation. Accordingly, if the fixing pin is set to a mode coming in contact with the rear face of the substrate or an inner wall face of the through hole in a state before the deformation and the fixing pin is deformed by applying stress and is inserted into the through hole and is set to a predetermined temperature or more in a state for passing through the through hole or inserting the fixing pin into the through hole, the fixing pin comes in contact with the substrate so that the positioning state is fixed.

Alternatively, each fixing member is a screw having a head and a column. The head connects to the column. The substrate further includes a plurality of through holes, each of which penetrates the substrate. The housing further includes a plurality of screw holes corresponding to the through holes of the substrate and the screws, respectively. The substrate has a first surface and a second surface. Each support portion contacts the first surface of the substrate, and the column of the screw penetrates the through hole, and the head of the screw contacts the second surface of the substrate, so that the screw screws on the housing. In this case, it may be also set to a construction in which the fixing means is a screw constructed by a head portion and a columnar portion connected to this head portion; a through hole passing through a portion between the surface and the rear face is arranged in the substrate; a screw hole corresponding to a predetermined range from a tip of the columnar portion is arranged in the housing; and the head portion comes in contact with the rear face of the substrate in a state in which the support portion comes in contact with the surface of the substrate; and the columnar portion is fixed to the housing through the through hole. In this case, when the terminal is positioned and fixed (the connector is positioned and fixed with respect to the substrate), the terminal is positioned by the columnar portion of the screw passing through the substrate in a planar direction of the substrate, and is also positioned by the support portion in a thickness direction of the substrate. The above positioning state can be fixed by nipping support using the head portion of the screw and the support portion. Further, in the case of screw fastening, the connector can be more rigidly fixed to the substrate in comparison with the fixing pin. Namely, connection reliability can be further improved.

Alternatively, each fixing member has a part, which is fixed on the support portion. In this case, positioning accuracy of the terminal with respect to the substrate surface can be improved.

Alternatively, each support portion has a metal part, which is connected to a part of the housing. The fixing member is connected to another part of the housing, the another part being different from the part of the housing. The substrate further includes a plurality of dummy lands corresponding to the support portions, and each support portion is connected to the dummy land through the bonding member. In this case, it is also possible to adopt a construction in which at least one portion of the support portion is constructed by a metal, and the support portion is arranged in a part different from a fixing part of the fixing means in the housing, a dummy land is arranged in the substrate correspondingly to the support portion and the support portion is joined to the dummy land through the joining material. In this case, since the support portion is joined to the dummy land through the joining material, the above positioning state can be fixed by the fixing means and the support portion. Further, the connector can be rigidly fixed to the substrate in comparison with a case joined to no dummy land. Accordingly, connection reliability can be further improved.

Alternatively, the housing has a rectangular solid shape with two sides disposed in a longitudinal direction of the rectangular solid shape. At least one support portion is connected to one of two sides of the housing. The substrate further includes a wiring, which is disposed between the support portion and the lands on the substrate, and the wiring is electrically connected to one of the lands. In this case, in a construction in which the support portion is arranged at, at least, both ends of the housing in a longitudinal direction of the connector, a predetermined clearance is arranged between the land of an end portion of the substrate in the longitudinal direction and the support portion near this land so that wiring electrically connected to one of the lands can be also arranged at this clearance. Further, two lands on the substrate corresponding to two of the terminals nearest the sides of the housing provide power lands, respectively, and the wiring is electrically connected to one of the power lands. In this case, it is also possible to adopt a construction in which the land of the end portion in the longitudinal direction is a land of a power system, and the wiring is electrically connected to this land.

Alternatively, each terminal is prepared by punching a metal plate. Here, in the case of a punching terminal formed by punching a metallic plate, shape dispersion every terminal can be reduced in comparison with a so-called bending terminal formed by bending a metal of a bar shape. Namely, dispersion of height with respect to the substrate surface every terminal can be reduced. However, since an elastic deforming amount is small, an effect for buffering stress by elastic deformation is small when the terminal is pressed against the land. Accordingly, there is a fear that a defect such as breaking, bending, etc. is caused in the terminal. Therefore, as described in the above structure, while the above defect is dissolved, processing accuracy of the terminal itself is superposed, and connection reliability can be further raised.

Alternatively, the mounting structure further includes a casing for accommodating the substrate with the surface mounting connector. The casing is capable of mounting on an automotive vehicle, and the casing provides an electronic control unit. In the mounting structure of the connector, the connector is positioned and fixed to the substrate by the support portion and the fixing means, and deformation (warp) of the substrate and the housing due to a temperature change can be reduced. Accordingly, it is also suitable for an electronic controller for vehicle mounting in which the electronic controller is stored into a box body and a vibration and an impact are applied to the electronic controller under a high temperature environment.

According to a second aspect of the present disclosure, a method for mounting a surface mounting connector on a substrate includes: positioning and fixing the connector having a plurality of terminals on the substrate having a plurality of lands in such a manner that each terminal of the connector is disposed on a corresponding land of the substrate through a bonding member; and bonding each terminal to the corresponding land through the bonding member by heating and melting the bonding member.

Thus, the joining material is cooled and solidified from a melting state in a state in which the connector is positioned and fixed to the substrate so as to set the terminal to abut on the joining material arranged on the surface of the corresponding land. The terminal and the land are then joined. Accordingly, connection reliability of the terminal and the corresponding land can be improved. The positioning fixation process may be also completed before the joining material is heated (i.e., before the reflow), and may be also completed while the joining material is heated (i.e., during the reflow).

Alternatively, the connector further includes a housing, a plurality of support portions and a plurality of fixing members. Each support portion protrudes from the housing toward the substrate. Each fixing member has a part connected to the housing. The positioning includes: contacting each support portion on a surface portion of the substrate so that the connector is supported on the substrate with the support members; and contacting each fixing member to a part of the substrate, which is different from the surface portion of the substrate. The connector is positioned and fixed on the substrate with the support portions and the fixing members. Further, the method further includes: integrating the fixing members with the housing, wherein each fixing member is a fixing pin; and forming a plurality of through holes on the substrate, wherein each through hole penetrates the substrate and corresponds to the fixing pin. The substrate has a first surface and a second surface. Each support portion contacts the first surface of the substrate, and the fixing pin penetrates the through hole so that the fixing pin contacts the second surface of the substrate. Furthermore, the fixing pin has a tapered portion, which expands a diameter of the through hole, and the tapered portion is disposed from a top of the fixing pin to a predetermined position of the fixing pin. Further, the method further includes: forming a groove having a predetermined depth on a top of the fixing pin; and inserting a jig into the groove after positioning the connector on the substrate so that the tapered portion is expanded and contacts an inner wall of the through hole.

Alternatively, the fixing pin has a spring portion, which is elastically deformable, and the spring portion is disposed from a top of the fixing pin to a predetermined position of the fixing pin. Further, the method further includes: bonding a part of the spring portion with a adhesive in order to be inserted into the through hole. In the bonding each terminal to the corresponding land, the adhesive is melted so that the spring portion contacts the substrate.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A mounting structure comprising:
   a surface mounting connector including a housing and a plurality of terminals, wherein each terminal extends from the housing;
   a substrate including a plurality of lands, each of which corresponds to one of the terminal, respectively, wherein each land is disposed on the substrate, and wherein each land is electrically connected to the terminal with a bonding member;
   a plurality of support portions for supporting the connector on the substrate, wherein each support portion protrudes from the housing toward the substrate, and contacts a surface portion of the substrate; and
   a plurality of fixing members for fixing and positioning the connector with respect to the substrate, wherein each fixing member is connected to the housing, and contacts a part of the substrate, which is different from the surface portion of the substrate contacting the support portion, wherein
   each terminal is positioned on the substrate with a predetermined distance between the terminal and the substrate by the support portions and the fixing members,
   the housing is in contact with the substrate through the support portions so that portions of the housing other than the support portions are spaced apart from the substrate by a predetermined distance,
   each terminal is a punching terminal, so that each terminal is connected to the corresponding land without being bent,
   each punching terminal has an elastic deforming amount along a direction perpendicular to the substrate, and
   the elastic deforming amount is equal to or smaller than a predetermined value.

2. The mounting structure according to claim 1, each terminal does not directly contact the land so that the terminal is coupled with the land through the bonding member.

3. The mounting structure according to claim 1, wherein
   each fixing member is a screw having a head and a column,
   the head connects to the column,
   the substrate further includes a plurality of through holes, each of which penetrates the substrate,
   each support portion further includes a screw hole corresponding to the through hole of the substrate and the screw,
   the substrate has a first surface and a second surface,
   each support portion contacts the first surface of the substrate, and
   the column of the screw penetrates the through hole, and the head of the screw contacts the second surface of the substrate, so that the screw screws on the housing.

4. The mounting structure according to claim 1, wherein each terminal is prepared by punching a metal plate.

5. The mounting structure according to claim 1, further comprising:

a casing for accommodating the substrate with the surface mounting connector, wherein the casing is capable of mounting on an automotive vehicle, and the casing provides an electronic control unit.

6. The mounting structure according to claim 1, wherein two of support portions are disposed on two ends of the housing respectively, and at least one of the two of support portions connects the substrate and the housing.

7. The mounting structure according to claim 1, wherein each terminal includes an end, which is in parallel to the substrate and bonded to a respective land with the bonding member.

8. The mounting structure according to claim 1, wherein each terminal is separated from a respective land so that the bonding member is sandwiched between the terminal and the land.

9. The mounting structure according to claim 1, wherein a shape of each punching terminal is defined, and each punching terminal is bonded to a corresponding one of the lands.

10. The mounting structure according to claim 1, wherein each fixing member is a fixing pin, which is integrated with the housing, the substrate further includes a plurality of through hales, each of which penetrates the substrate, the substrate has a first surface and a second surface, each support portion contacts the first surface of the substrate, and the fixing pin penetrates the through hole so that the fixing pin contacts the second surface of the substrate.

11. The mounting structure according to claim 10, wherein the fixing pin has a spring portion, which is elastically deformable, and the spring portion is disposed in a range between a distal end of the fixing pin to a predetermined middle position of the fixing pin.

12. The mounting structure according to claim 10, wherein the fixing pin is made of shape-memory alloy.

13. The mounting structure according to claim 10, wherein each fixing member has a part, which is fixed on the support portion.

14. The mounting structure according to claim 10, wherein each fixing pin has a rod shape or a plate shape, the fixing pin further includes a straight portion and a bending portion, the straight portion penetrates the through hole, and the bending portion is bent along with the second surface of die substrate so that the bending portion of the fixing pin contacts the second surface of the substrate.

15. The mourning structure according to claim 14, wherein the bending portion is beat toward the connector.

16. The mounting structure according to claim 15, wherein the bending portion is bent toward a mass center of the connector.

17. The mounting structure according to claim 1, wherein each fixing member is a fixing pin, which is integrated with the housing, the substrate further includes a plurality of through holes, each of which penetrates the substrate, and has an inner wall, the substrate has a first surface and a second surface, each support portion contacts the first surface of the substrate, and the fixing pin is inserted into the through hole, and the fixing pin only contacts the inner wall of the through hole.

18. The mounting structure according to claim 17, wherein a diameter of the fixing pin at a proximal end of the fixing pin, which is proximate to the housing, is greater than a diameter of the through hole, and the fixing pin is tapered such that the fixing pin becomes narrower toward a distal end of the fixing pin, which is opposite to the proximal end.

19. The mounting structure according to claim 18, wherein the tapered portion includes a plurality of protrusions.

20. The mounting structure according to claim 1, wherein each support portion has a metal part, which is connected to a first part of the housing, the fixing member is connected to a second part of the housing, the second part being different from the first part of the housing, the substrate further includes a plurality of dummy lands corresponding to the support portions, and each support portion is connected to the dummy land through the bonding member.

21. The mounting structure according to claim 20, wherein the housing has a rectangular solid shape with two sides disposed in a longitudinal direction of the rectangular solid shape, at least one support portion is connected to one of two sides of the housing, the substrate further includes a wiring, which is disposed between the support portion and the lands on the substrate, and the wiring is electrically connected to one of the lands.

22. The mounting structure according to claim 21, wherein two lands on the substrate corresponding to two of the terminals nearest the sides of the housing provide power lands, respectively, and the wiring is electrically connected to one of the power lands.

23. The mounting structure according to claim 1, wherein each support portion has a rectangular shape with first and second sides the first side is in parallel to a longitudinal side of the housing, the second side is perpendicular to the first side, and the first side is smaller than the second side.

24. The mounting structure according to claim 23, wherein the plurality of terminals is disposed on the longitudinal side of the housing.

25. A method for mounting a surface mounting connector on a substrate, the method comprising:

positioning and fixing the connector having a plurality of terminals on the substrate having a plurality of lands with a plurality of fixing members in such a manner that each terminal of the connector is disposed on a corresponding land of the substrate through a bonding member, bonding each terminal to the corresponding land trough the bonding member by heating and melting the bonding member without bending any of the terminals, and contacting a housing of the connector with the substrate through a plurality of support portions so that portions of the housing other than the support portions are spaced apart from the substrate by a predetermined distance, each fixing member contacts a part of the substrate that is different from surface portions of the substrate contacting the support portions, each support portion protrudes from the housing toward the substrate, each terminal extends from the housing, each terminal is positioned on the substrate with a predetermined distance between the terminal and the substrate by the support portions and the fixing members, each terminal is prepared by punching a metal plate, so that each terminal is a punching terminal, each punching terminal has an elastic deforming amount along a direction perpendicular to the substrate, and the elastic deforming amount is equal to or smaller than a predetermined value.

26. The method according to claim 25, wherein in the positioning, each terminal does not contact the corresponding land so that each terminal is coupled with the corresponding land through the bonding member.

27. The method according to claim 25, wherein a shape of each punching terminal is defined, and each punching terminal is bonded to a corresponding one of the lands.

28. The method according to claim 25, wherein the positioning and fixing includes connecting a part of each fixing member to the housing.

29. The method according to claim 28, further comprising:

integrating the fixing members with the housing, wherein each fixing member is a fixing pin; and forming a plurality of through holes on the substrate, wherein each through hole penetrates the substrate and corresponds to the fixing pin, wherein the substrate has a first surface and a second surface, each support portion contacts the first surface of the substrate, and the fixing pin is inserted into the through hole, and the fixing pin only contacts the inner wall of the through hole.

30. The method according to claim 28, wherein each fixing member is a screw having a head and a column, the head connects to the column, the substrate further includes a plurality of through holes, each of which penetrates the substrate, each support portion further includes a screw hole corresponding to the through hole of the substrate and the screw, the substrate has a first surface and a second surface, each support portion contacts the first surface of the substrate, and the column of each screw penetrates the through hole, and the head of the screw contacts the second surface of the substrate, so that the screw screws on the housing.

31. The method according to claim 28, wherein each fixing member has a part, which is fixed on the support portion.

32. The method according to claim 28, wherein each support portion has a metal part, which is connected to a part of the housing, each fixing member is connected to another part of the housing, the another part being different from the part of the housing, the substrate further includes a dummy land corresponding to the support portion, and the support portion is connected to the dummy land through the bonding member.

33. The method according to claim 28, further comprising:

integrating the fixing members with the housing, wherein each fixing member is a fixing pin; and forming a plurality of through holes an the substrate, wherein each through hole penetrates the substrate and corresponds to the fixing pin, wherein the substrate has a first surface and a second surface, each support portion contacts the first surface of the substrate, and the fixing pin penetrates the through hole so that the fixing pin contacts the second surface of the substrate.

34. The method according to claim 33, further comprising:

penetrating the fixing pin through the through hole, wherein the fixing pin has a rod shape or a plate shape, and further includes a straight portion and a bending portion; and bending the bending portion along with the second surface of the substrate so that the bending portion of the fixing pin contacts the second surface of the substrate.

35. The method according to claim 33, wherein the fixing pin has a spring portion, which is elastically deformable, and the spring portion is disposed from a top of the fixing pin to a predetermined position of the fixing pin.

36. The method according to claim 33, further comprising:

deforming the faxing pin, which is made of shape-memory alloy;

inserting the fixing pin into the through hole; and restoring the fixing pin to an original shape before the melted bonding member is hardened so that the fixing pin contacts the substrate.

37. The method according to claim 33, wherein a diameter of the fixing pin at a proximal end of the fixing pin, which is proximate to the housing, is greater than a diameter of the through hole, and the fixing pin is tapered such that the fixing pin becomes narrower toward a distal end of the fixing pin, which is opposite to the proximal end.

38. The method according to claim 37, wherein the tapered portion includes a plurality of protrusions.

39. A method for mounting a surface mounting connector on a substrate, the method comprising:

positioning and fixing the connector having a plurality of terminals on the substrate having a plurality of lands with a plurality of fixing members in such a manner that each terminal of the connector is disposed on a corresponding land of the substrate through a bonding member;

bonding each terminal to the corresponding land Through the bonding member by heating and melting the bonding member;

contacting a housing of the connector with the substrate through a plurality of support portions so that portions of the housing other than the support portions are spaced apart from the substrate by a predetermined distance, wherein the connector further includes a housing, a plurality of support portions and a plurality of fixing members, each support portion protrudes from the housing toward the substrate, each fixing member has a part connected to the housing, and the positioning includes:

contacting each support portion on a surface portion of the substrate so that the connector is supported on the substrate with the support portions; and contacting each fixing member to a part of the substrate, which is different from the surface portion of the substrate, and the connector is positioned and fixed on the substrate with the support portions and the fixing members, and the method further includes:

integrating the fixing members with the housing, wherein each fixing member is a fixing pin; and forming a plurality of through holes on the substrate, wherein each through hole penetrates the substrate and corresponds to the fixing pin, wherein the substrate has a first surface and a second surface, each support portion contacts the first surface of the substrate, the fixing pin penetrates the through hole so that the fixing pin contacts the second surface of the substrate, a diameter of the fixing pin at a proximal end of the fixing pin, which is proximate to the housing, is greater than a diameter of the through hole, and the fixing pin is tapered such that the fixing pin becomes narrower toward a distal end of the fixing pin, which is opposite to the proximal end, and the method further includes:

forming a groove having a predetermined depth on a top of the fixing pin; and inserting jig into the groove after positioning the connector on the substrate so that the tapered portion is expanded and contacts an inner wall of the through hole.

40. A method for mounting a surface mourning connector on a substrate, the method comprising:

positioning and fixing the connector having a plurality of terminals on the substrate having a plurality of lands with a plurality of fixing members in such a manner that each terminal of the connector is disposed on a corresponding land of the substrate through a bonding member;

bonding each terminal to the corresponding land through the bonding member by beating and melting the bonding member;

contacting a housing of the connector with the substrate through a plurality of support portions so that portions of the housing other than the support portions are spaced apart from the substrate by a predetermined distance, wherein the connector further includes a housing, a plurality of support portions and a plurality of fixing members, each support portion protrudes from the housing toward the substrate, each fixing member has a part connected to the housing, and the positioning includes:

contacting each support portion on a surface portion of the substrate so that the connector is supported on the substrate with the support portions; and the fixing pin has a spring portion, which is elastically deformable, and the spring portion is disposed from a top of the fixing pin to a predetermined position of the fixing pin, and the method further includes:

bonding a part of the spring portion with an adhesive in order to be inserted into the through hole, wherein in the bonding each terminal to the corresponding land, the adhesive is melted so that the spring portion contacts the substrate.

41. A mounting structure comprising:

a surface mounting connector including a housing and a plurality of terminals, wherein each terminal extends from the housing;

a substrate including a plurality of lands, each of which corresponds to a respective terminal, wherein each land is disposed on the substrate, and wherein each land is electrically connected to the terminal with a bonding member a plurality of support portions for supporting the connector on the substrate, wherein each support portion protrudes from the housing toward the substrate, and contacts a surface portion of the substrate; and a plurality of fixing members for fixing and positioning the connector with respect to the substrate, wherein each fixing member is connected to the housing, and contacts a part of the substrate, which is different from the surface portion of the substrate contacting the support portion, wherein each terminal is positioned on the substrate with a predetermined distance between the terminal and the substrate by the support portions and the fixing members, the support portions includes first, second and third support portions, each of the first and second support portions is disposed on a respective end of the housing, at least one of the first and second support portions connects the substrate and the housing, and the third support portion is disposed on a predetermined middle portion of the housing.

\* \* \* \* \*